United States Patent
Fukuzawa et al.

(10) Patent No.: US 8,305,716 B2
(45) Date of Patent: *Nov. 6, 2012

(54) MAGNETO-RESISTANCE EFFECT ELEMENT INCLUDING DIFFUSIVE ELECTRON SCATTERING LAYER, MAGNETO-RESISTANCE EFFECT HEAD, MAGNETIC STORAGE AND MAGNETIC MEMORY

(75) Inventors: Hideaki Fukuzawa, Kawasaki (JP); Masahiro Takashita, Yokohama (JP); Hiromi Yuasa, Kawasaki (JP); Yoshihiko Fuji, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/360,143

(22) Filed: Jan. 27, 2012

(65) Prior Publication Data

US 2012/0129008 A1  May 24, 2012

Related U.S. Application Data

(60) Continuation of application No. 12/879,642, filed on Sep. 10, 2010, now Pat. No. 8,130,477, which is a division of application No. 11/525,076, filed on Sep. 22, 2006, now Pat. No. 7,821,748.

(30) Foreign Application Priority Data

Sep. 29, 2005 (JP) ................................. 2005-285240

(51) Int. Cl.
*G11B 5/36* (2006.01)
(52) U.S. Cl. .................................................. 360/324.2
(58) Field of Classification Search ................ 360/324.2
See application file for complete search history.

(56) References Cited

U.S. PATENT DOCUMENTS

| 5,608,593 | A | 3/1997 | Kim et al. |
| 5,668,688 | A | 9/1997 | Dykes et al. |
| 6,074,743 | A | 6/2000 | Araki et al. |
| 6,080,445 | A | 6/2000 | Sugiyama et al. |
| 6,132,892 | A | 10/2000 | Yoshikawa et al. |

(Continued)

FOREIGN PATENT DOCUMENTS

CN 1419232 5/2003
(Continued)

OTHER PUBLICATIONS

Covington et al, "Current-induced magnetization dynamics in current perpendicular to the plane spin valves", Physical Review B 69:184406 (2004), pp. 1-8.

(Continued)

*Primary Examiner* — Allen Heinz
(74) *Attorney, Agent, or Firm* — Nixon & Vanderhye, P.C.

(57) ABSTRACT

An example magneto-resistance effect element includes a magnetization layer and a free magnetization layer of which magnetization direction changes depending on an external magnetic field. A spacer layer is located between the magnetization layer and the free magnetization layer, and has an insulating layer and an electric conductor passing current therethrough in a layer direction of the insulating layer. A diffusive electron scattering layer is disposed on said free magnetization layer for scattering diffusive electrons. The scattering layer includes a first nonmagnetic layer and a second nonmagnetic layer containing a first element and a second element, respectively, and a mixing layer disposed at a boundary between the first and second nonmagnetic layers and containing the first and second elements. The mixing layer has a thickness of 0.5 nm or more and 1.5 nm or less.

6 Claims, 9 Drawing Sheets

U.S. PATENT DOCUMENTS

| | | | |
|---|---|---|---|
| 6,159,593 | A | 12/2000 | Iwasaki et al. |
| 6,169,303 | B1 | 1/2001 | Anthony |
| 6,313,973 | B1 | 11/2001 | Fuke et al. |
| 6,411,476 | B1 | 6/2002 | Lin et al. |
| 6,452,763 | B1 | 9/2002 | Gill |
| 6,511,855 | B2 | 1/2003 | Anthony |
| 6,686,068 | B2 | 2/2004 | Carey et al. |
| 6,707,649 | B2 | 3/2004 | Hasegawa et al. |
| 6,775,111 | B2 | 8/2004 | Lin et al. |
| 6,780,524 | B2 | 8/2004 | Lin et al. |
| 6,781,799 | B2 | 8/2004 | Seyama et al. |
| 6,784,509 | B2 | 8/2004 | Yuasa et al. |
| 6,785,103 | B2 | 8/2004 | Cornwell et al. |
| 6,788,499 | B2 | 9/2004 | Lin et al. |
| 6,833,981 | B2 | 12/2004 | Suwabe et al. |
| 6,905,780 | B2 | 6/2005 | Yuasa et al. |
| 6,927,952 | B2 | 8/2005 | Shimizu et al. |
| 6,937,447 | B2 | 8/2005 | Okuno et al. |
| 6,961,224 | B2 | 11/2005 | Pinarbasi |
| 7,002,781 | B2 | 2/2006 | Sugawara |
| 7,071,522 | B2 | 7/2006 | Yuasa et al. |
| 7,072,153 | B2 | 7/2006 | Koui et al. |
| 7,116,529 | B2 | 10/2006 | Yoshikawa et al. |
| 7,130,167 | B2 | 10/2006 | Gill |
| 7,180,714 | B2 | 2/2007 | Gill |
| 7,215,516 | B2 | 5/2007 | Yoshikawa et al. |
| 7,221,545 | B2 | 5/2007 | Gill |
| 7,223,485 | B2 | 5/2007 | Yuasa et al. |
| 7,245,462 | B2 | 7/2007 | Huai et al. |
| 7,301,733 | B1 | 11/2007 | Fukuzawa et al. |
| 7,331,100 | B2 | 2/2008 | Li et al. |
| 7,336,453 | B2 | 2/2008 | Hasegawa et al. |
| 7,369,373 | B2 | 5/2008 | Gill |
| 7,379,278 | B2 | 5/2008 | Koui et al. |
| 7,390,529 | B2 | 6/2008 | Li et al. |
| 7,423,850 | B2 | 9/2008 | Gill et al. |
| 7,426,098 | B2 | 9/2008 | Yuasa et al. |
| 7,443,004 | B2 | 10/2008 | Yuasa et al. |
| 7,514,117 | B2 | 4/2009 | Fukuzawa et al. |
| 7,525,776 | B2 | 4/2009 | Fukuzawa et al. |
| 7,593,195 | B2 | 9/2009 | Fukuzawa et al. |
| 7,821,748 | B2 | 10/2010 | Fukuzawa et al. |
| 2001/0040781 | A1 | 11/2001 | Tanaka et al. |
| 2002/0048127 | A1 | 4/2002 | Fukuzawa et al. |
| 2002/0048128 | A1 | 4/2002 | Kamiguchi et al. |
| 2002/0051380 | A1 | 5/2002 | Kamiguchi et al. |
| 2002/0073785 | A1 | 6/2002 | Prakash et al. |
| 2002/0150791 | A1 | 10/2002 | Yuasa et al. |
| 2002/0151791 | A1 | 10/2002 | Nozaki et al. |
| 2003/0090844 | A1 | 5/2003 | Shimizu et al. |
| 2003/0123200 | A1 | 7/2003 | Nagasaka et al. |
| 2003/0128481 | A1 | 7/2003 | Seyama et al. |
| 2003/0231436 | A1 | 12/2003 | Nishiyama |
| 2004/0021990 | A1 | 2/2004 | Koui et al. |
| 2004/0201929 | A1 | 10/2004 | Hashimoto et al. |
| 2005/0111145 | A1 | 5/2005 | Yuasa et al. |
| 2005/0168887 | A1 | 8/2005 | Yuasa et al. |
| 2006/0034022 | A1 | 2/2006 | Fukuzawa et al. |
| 2006/0050444 | A1 | 3/2006 | Fukuzawa et al. |
| 2006/0071287 | A1 | 4/2006 | Koui et al. |
| 2006/0098353 | A1 | 5/2006 | Fukuzawa et al. |
| 2006/0181814 | A1 | 8/2006 | Koui et al. |
| 2007/0014054 | A1 | 1/2007 | Zhang et al. |
| 2007/0172690 | A1 | 7/2007 | Kim et al. |
| 2007/0223150 | A1 | 9/2007 | Fukuzawa et al. |
| 2009/0141408 | A1 | 6/2009 | Fukuzawa et al. |

FOREIGN PATENT DOCUMENTS

| | | |
|---|---|---|
| CN | 1431651 | 7/2003 |
| EP | 1 548 762 | 6/2005 |
| JP | 08-49063 | 2/1996 |
| JP | 11-86229 | 3/1999 |
| JP | 11-121832 | 4/1999 |
| JP | 11-154609 | 6/1999 |
| JP | 11/296820 | 10/1999 |
| JP | 2000-228004 | 8/2000 |
| JP | 2001-94173 | 4/2001 |
| JP | 2002-76473 | 3/2002 |
| JP | 2002-208744 | 7/2002 |
| JP | 2003-60263 | 2/2003 |
| JP | 2004-006589 | 1/2004 |
| JP | 2004-153248 | 5/2004 |
| JP | 2004-259363 | 9/2004 |
| JP | 2005-109378 | 4/2005 |
| JP | 2005-191312 | 7/2005 |

OTHER PUBLICATIONS

Covington et al, "Spin transfer effects in current perpendicular to the plane spin valves", Journal of Magnetism and Magnetic Materials 287:325-332 (2005).

Yuasa et al, "Output enhancement of spin-valve giant magnetoresistance in current-perpendicular-to-plane geometry", Journal of Applied Physics 92(5):2646-2650 (2002).

Fukuzawa et al, "Large magnetoresistance ratio of 10% by $Fe_{50}CO_{50}$ layers for current-confined-path current-perpendicular-to-plane giant magnetoresistance spin-valve films", Applied Physics Letters 87:082507 (2005), 3 pages.

M. Takagishi, et al., "The Applicability of CPP-GMR heads for Magnetic Recording", IEEE Transactions on Magnetics, vol. 38, No. 5, Sep. 2002; pp. 2277-2282.

H. Yuasa et al., "Output enhancement of spin-valve giant magnetoresistance in current-perpendicular-to-plane geometry," Journal of Applied Physics, vol. 92, No. 5, Sep. 1, 2002, pp. 2646-2650.

Hideaki Fukuzawa, et al., "MR Ratio Enhancement by NOL Current-Confined-Path Structures in CPP Spin Valves," IEEE Transactions on Magnetics, vol. 40, No. 4, Jul. 2004, pp. 2236-2238.

K. Nagasaka et al., "Giant magnetroresistance properties of specular spin valve films in a current perpendicular to plane structure," Journal of Applied Physics, vol. 89, No. 11, Jun. 1, 2001, pp. 6943-6345.

Fukuzawa et al., "Nanoconstricted structure for current-confined path in current-perpendicular-to-plane spin valves with high magnetoresistance," Journal of Applied Physics 97, 10C509 (2005).

K. Meguro et al., "Spin-valve films using synthetic ferrimagnets for pinned layer," IEEE Trans. Mag., 35(5), Sep. 1999, 2925-2927 (Abstract).

C. Vouille et al., "Inverse CPP-GMR in (A/Cu/Co/Cu) multilayers (A-NiCr, FeCr, FeV) and discussion of the spin asymmetry induced by impurities," J. Appl. Phys., vol. 81, Issue 8 4573 (1997) (Abstract).

J. Bass et al., "Current-perpendicular (CPP) magnetoresistance in magnetic metallic multilayers," J. Magn. Magn. Mater, 200 (1-3); 274-289 (Oct. 1999). (Abstract).

L. Vila et al., "Current Perpendicular Magnetoresistances of NiFeCo and NiFe Permalloys," Journal of Applied Physics, vol. 87, No. 12, pp. 8610-8614 (Jun. 15, 2000). (Abstract).

A.C. Reilly et al., "Perpendicular giant magnetoresistance of $Co_{91}/Fe_9$/Cu exchange-biased spin-valves: further evidence for a unified picture," J. Magn. Magn. Mater, V. 195, No. 2, pp. L269-L274 (1999). (Abstract).

Office Action dated May 24, 2011 in JP Application No. 2005-285240 and partial English-language translation of same.

When inserted only into free layer

| | Without adjustment layer | Pt 0.5 nm | | | Ti 0.5 nm | | | Zr 0.5 nm | | | Pd 0.5 nm | | | Al 0.5 nm | | |
|---|---|---|---|---|---|---|---|---|---|---|---|---|---|---|---|---|
| Distance | - | 0 nm | 1 nm | 2 nm | 0 nm | 1 nm | 2 nm | 0 nm | 1 nm | 2 nm | 0 nm | 1 nm | 2 nm | 0 nm | 1 nm | 2 nm |
| MR ratio | 8% | 0.5% | 7.8% | 8.0% | 7.8% | 8.0% | 8.0% | 7.8% | 8.0% | 8.0% | 7.8% | 8.0% | 8.0% | 7.5% | 7.8% | 8.0% |
| | 10% | 0.8% | 9.5% | 10% | 10% | 10% | 10% | 10% | 10% | 10% | 10% | 10% | 10% | 9.5% | 9.5% | 9.5% |
| | CE0 | CE1 | E1 | E2 | E3 | E4 | E5 | E6 | E7 | E8 | E9 | E10 | E11 | E12 | E13 | E14 |

CE= Comparative Example
E= Example

FIG. 7

When inserted only into pin layer

| | Without adjustment layer | Pt 0.5 nm | | | Ti 0.5 nm | | | Zr 0.5 nm | | | Pd 0.5 nm | | | Al 0.5 nm | | |
|---|---|---|---|---|---|---|---|---|---|---|---|---|---|---|---|---|
| Distance | - | 0 nm | 1 nm | 2 nm | 0 nm | 1 nm | 2 nm | 0 nm | 1 nm | 2 nm | 0 nm | 1 nm | 2 nm | 0 nm | 1 nm | 2 nm |
| MR ratio | 8% | 0.3% | 7.5% | 7.8% | 6.3% | 7.8% | 7.8% | 6.5% | 7.8% | 7.8% | 6.5% | 7.8% | 7.8% | 6.5% | 7.7% | 7.8% |
| | 10% | 0.5% | 9.3% | 9.5% | 7.0% | 9.3% | 9.5% | 7.0% | 9.3% | 9.3% | 7.0% | 9.3% | 9.5% | 7.5% | 9.2% | 9.2% |
| | CE0 | CE2 | E21 | E22 | E23 | E24 | E25 | E26 | E27 | E28 | E29 | E30 | E31 | E32 | E33 | E34 |

CE= Comparative Example
E= Example

FIG. 8

When inserted into both free layer & pin layer

| | Without adjustment layer | Pt 0.5 nm | | | Ti 0.5 nm | | | Zr 0.5 nm | | | Pd 0.5 nm | | | Al 0.5 nm | | |
|---|---|---|---|---|---|---|---|---|---|---|---|---|---|---|---|---|
| Distance | - | 0 nm | 1 nm | 2 nm | 0 nm | 1 nm | 2 nm | 0 nm | 1 nm | 2 nm | 0 nm | 1 nm | 2 nm | 0 nm | 1 nm | 2 nm |
| MR ratio | 8% | 0.0% | 7.0% | 7.3% | 6.3% | 7.5% | 7.6% | 6.0% | 7.3% | 7.5% | 6.0% | 7.3% | 7.5% | 6.1% | 7.2% | 7.5% |
| | 10% | 0.1% | 8.5% | 9.0% | 7.0% | 9.0% | 9.3% | 6.5% | 9.0% | 9.3% | 6.5% | 8.9% | 9.2% | 7.0% | 9.0% | 9.0% |
| | CE0 | CE3 | E41 | E42 | E43 | E44 | E45 | E46 | E47 | E48 | E49 | E50 | E51 | E52 | E53 | E54 |

CE= Comparative Example
E= Example

FIG. 9

MAGNETO-RESISTANCE EFFECT ELEMENT INCLUDING DIFFUSIVE ELECTRON SCATTERING LAYER, MAGNETO-RESISTANCE EFFECT HEAD, MAGNETIC STORAGE AND MAGNETIC MEMORY

CROSS-REFERENCE TO RELATED APPLICATIONS

This application is a continuation of application Ser. No. 12/879,642, filed Sep. 10, 2010, now U.S. Pat. No. 8,130,477, which is a divisional of application Ser. No. 11/525,076, filed Sep. 22, 2006, now U.S. Pat. No. 7,821,748, which is based upon and claims the benefit of priority from the prior Japanese Patent Application No. 2005-285240, filed on Sep. 29, 2005; the entire contents of which are incorporated herein by reference.

BACKGROUND OF THE INVENTION

1. Field of the Invention

The present invention relates to a magneto-resistance effect element, a magneto-resistance effect head, a magnetic storage and a magnetic memory that flow sense current in the direction perpendicular to a film surface of a magneto-resistance effect film to detect magnetism.

2. Description of the Related Art

With the discovery of Giant Magnet-Resistance Effect (GMR), magnetic devices, among others, magnetic heads are showing dramatic improvement in performance. In particular, the application of a spin-valve (SV) film to the magnetic head, an MRAM (Magnetic Random Access Memory) and the like has brought about substantial technological progress in the field of the magnetic devices.

The "spin-valve film" means a stacked film composed of two ferromagnetic layers and a nonmagnetic spacer layer sandwiched therebetween, in which the magnetization of the ferromagnetic layer on one side (generally referred to as a "pin layer" or a "fixed magnetization layer") is fixed by an antiferromagnetic layer or the like to make the magnetization of the ferromagnetic layer on the other side (generally referred to as a "free layer" or a "free magnetization layer") turn in accordance with an external magnetic field. In the spin-valve film, a great magneto-resistance change can be obtained by the change in the relative angle between the magnetization directions of the pin layer and the free layer.

Conventionally, the spin-valves have been CIP (Current In Plane)—GMR elements passing current in parallel with the film surface. In recent years, a CPP (Current Perpendicular to Plane)—GMR element (hereinafter referred to as the "CPP element") is receiving attention in that the CPP element can exhibit larger GMR effect than the CIP-GMR element. When considering the application of these magneto-resistance effect elements to the magnetic heads, there arises a problem in view of shot noise and high-frequency response when the resistances of the elements increase. As for the resistance of the element, it is adequate to evaluate it with RA (resistance× current passing area). Specifically, when recording density is beyond 300 Gbpsi (Gigabit per square inch), RA is required to be several hundreds m$\Omega\mu m$ to 1 m$\Omega\mu m^2$; and when the recording density is 600 Gbpsi, RA is required to be 500 m$\Omega\mu m^2$ or below.

With respect to these requirements, the CPP element has a potential to obtain a larger MR (Magneto-Resistance) rate of change even when the resistance is low in the trend of the magnetic devices being miniaturized increasingly. Under such a circumstance, the CPP element and the magnetic head using the same are considered to be potential candidates to realize the recording density of 300 Gbpsi to 1 Tbpsi (Terabit per square inch).

However, in the case of a metal CPP element of which pin layer/spacer layer/free layer (this three-layer structure is called a spin-dependent scattering unit or the spin-valve film) are formed by metal layers, it is difficult to detect a weak magnetic field accompanied by increasing density.

In order to bring a solution to this problem, there is proposed a CPP element using, as a spacer layer, an oxide layer [NOL (nano-oxide layer)] including current pass in the thickness direction (for example, refer to Patent Document 1 (Japanese Patent Laid-Open Application No. 2002-208744)). Such a CPP element can increase both the element resistance and an MR ratio backed by a current-confined-path (CCP) effect. Hereinafter, such an element is referred to as the CCP-CPP element.

Here, along with the trend of microfabrication in the elements (magnetic devices), the size in the plane direction of the CPP spin-valve film is required to be smaller than 100 nm×100 nm. For instance, due to increasing density of the magnetic disk, a track width of 100 nm or below is required.

There is reported that noise caused by a spin-transfer torque arises when letting sense current to flow in the perpendicular direction of the film surface of such a CPP spin-valve film of smaller area. (refer to Generation of STI (Spin-Transfer Induced) Noise, Non-patent Document 1 (M. Covington et al., Phys. Rev. B69, 184406 (2004)); and Non-patent Document 2, (M. Covington et al., J. Magn. Magn. Mater. 287, 325 (2005))).

A spin-transfer torque effect is a phenomenon in which the magnetization direction of the free layer changes, even in a state where no external magnetic field is applied, when passing current of a critical value or more through the CPP spin-valve film. At this time, when the current-passing direction changes, the magnetization direction of the free layer may invert. In other words, when the current-passing direction is fixed to a single direction, the stabilized direction of the magnetization of the free layer is fixed to a single direction. Note that the stabilized direction of the magnetization at this time is described below. When electrons flow from the pin layer to the free layer (current flows from the free layer to the pin layer), a spin transfer torque such that the magnetization direction of the free layer goes along the direction of the pin layer works. Meanwhile, when electrons flow from the free layer to the pin layer (current flows from the pin layer to the free layer), a spin transfer torque such that the magnetization direction of the free layer goes in antiparallel with the magnetization direction of the pin layer works.

In the magnetic head, the magnetization direction of the free layer changes depending on the direction of a medium magnetic field. Therefore, when the current-passing direction is constant, the free layer may become unstable in view of magnetization to induce the noise, depending on the magnetization direction of the free layer. In this manner, even in the state where the sense current is made to flow without applying the external magnetic field, the magnetization in the free layer may become unstable to increase the noise of the element. This noise is called STI (Spin-Transfer Induced) noise since the noise is induced by the spin-transfer torque effect. When the STI noise arises, the noise increases even when a signal output is constant, causing an S/N ratio to degrade to finally increase a BER (Bit Error Rate) in a HDD. As a result, it becomes difficult for the element to detect the weak medium magnetic field at the time of a high density recording, and therefore there is a risk that the element might become substantially unable to be used in the magnetic head and the like.

SUMMARY OF THE INVENTION

A magneto-resistance effect element according to an embodiment of the present invention includes: a fixed magnetization layer of which magnetization direction is substantially fixed to a single direction; a free magnetization layer of which magnetization direction changes depending on an external magnetic field; a spacer layer located between said fixed magnetization layer and said free magnetization layer, and having an insulating layer and an electric conductor passing current therethrough in a layer direction of the insulating layer; and a predetermined layer disposed in at least one of said fixed magnetization layer and said free magnetization layer, containing one element selected from the group consisting of Ti, Zr, Nb, Mo, Ru, Rh, Pd, Ag, La, Hf, Ta, W, Re, Os, Ir, Cr, Al, Pt, and Au, and having a thickness of 0.1 nm or more and 1 nm or less.

BRIEF DESCRIPTION OF THE DRAWINGS

FIG. 7 to FIG. 9 are tables showing dependencies of the MR ratio on the materials and the inserted positions.

DESCRIPTION OF THE EMBODIMENTS

Hereinafter, embodiments according to the present invention will be described with reference to the drawings. Note that in the embodiments, which will be described below, the composition of an alloy is presented by atomic %.

First Embodiment

Figure 1:
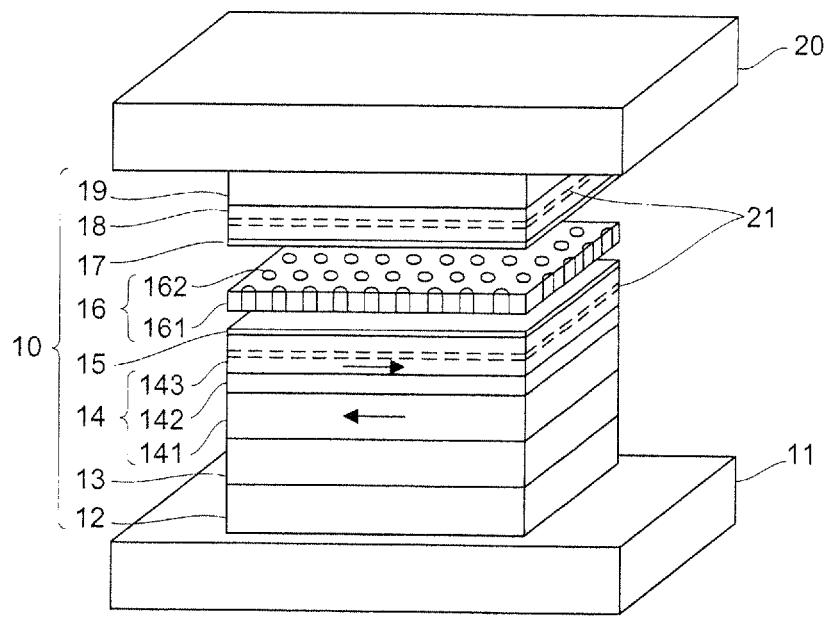
FIG. 1 is a perspective view showing a magneto-resistance effect element according to a first embodiment of the present invention.

FIG. 1 is a perspective view showing a magneto-resistance effect element (CCP-CPP element) according to a first embodiment of the present invention. Note that FIG. 1 and the drawings followed are all schematic views and the ratio of a film thickness of a film to the film thickness of another film is not always the same as the ratio as of the actual film thicknesses. As shown in FIG. 1, the magneto-resistance effect element according to the embodiment of the present invention includes a magneto-resistance effect film 10, and a lower electrode 11 and an upper electrode 20 sandwiching the magneto-resistance effect film 10 from above and below; and is configured on a not-shown substrate.

The magneto-resistance effect film 10 is composed of a underlayer 12, a pinning layer 13, a pin layer 14, a lower metal layer 15, a nano-oxide layer (NOL) with current-confined-paths (CCP) 16, an upper metal layer 17, a free layer 18, and a capping layer 19, which are stacked sequentially. The combination of a lower metal layer 15, a NOL with CCP 16, and an upper metal layer 17 is called a spacer layer. Of these, the pin layer 14, the spacer layer 15, the NOL with CCP 16, and the upper metal layer 17 and free layer 18, as a whole, correspond to a spin-valve film configured by sandwiching a non-magnetic spacer layer between two ferromagnetic layers. Note that, for the purpose of easy understanding, the spacer layer 16 is presented in a state separately from its upper and lower layers (the lower metal layer 15 and the upper metal layer 17).

In the present embodiment, a damping-factor (DF) adjustment layer 21 is inserted at least one of the pin layer 14 and the free layer 18 to reduce STI noise.

Note that the CCP-CPP element in FIG. 1 is of a bottom type spin-valve in which the pin layer 14 is disposed at the lower side, while the same of a top type spin-valve is also acceptable. Where, in top type spin-valve, the pin layer 14 is disposed at the upper side than a spacer layer, and the free layer 18 is disposed at the lower side than a spacer layer.

Hereinafter, components of the magneto-resistance effect element will be described.

The lower electrode 11 is an electrode to pass current in the direction perpendicular to the spin-valve film. With the application of voltage to between the lower electrode 11 and the upper electrode 20, the current flows inside the spin-valve film along the direction perpendicular to the film. With this current, it becomes possible to detect magnetization by detecting changes in resistance caused by magneto-resistance effect. As a specific material, a magnetic metal layer such as NiFe serving also as a lower shield or that of nonmagnetic Cu, Ta, Ru, Cr or the like is used.

The underlayer 12 can be classified into, for example, a buffer layer 12a and a seed layer 12b. The buffer layer 12a is a layer to buffer roughness of the surface of the lower electrode 11. The seed layer 12b is a layer to control crystal orientation and crystal grain diameter of the spin-valve film deposited thereon.

As a buffer layer 12a, Ta, Ti, W, Zr, Hf, Cr or their alloy can be used. The film thickness of the buffer layer 12a is preferably in the order of 0.5 nm to 10 nm, and more preferably in the order of 1 nm to 5 nm. The buffer layer 12a having an excessively small film thickness will lose its buffer effect. Meanwhile, the buffer layer 12a having an excessively large film thickness is undesirable since series resistance not serving to an MR change of rate increases. Note that the buffer layer 12a is not always necessity when the seed layer 12b deposited on the buffer layer 12a also has the buffer effect.

Any seed layer 12b is acceptable as long as it is made of a material capable of controlling the crystal orientation of the layer disposed thereon, however, a metal layer having a hcp structure (hexagonal close-packed structure) or an fcc structure (face-centered cubic structure) or a bcc structure (body-centered cubic structure) is preferable. With the use of Ru as a seed layer 12b, it is possible to control the crystal orientation of the spin-valve film thereon to have an fcc (111) orientation. Further, it is possible to control the pinning layer 13 (for example, IrMn) to have a fcc (111) crystal orientation. The other material which has a crystal structure such as fct structure (face-centered tetragonal structure) or a bcc (body-centered cubic structure) can be used.

The crystal orientations of the spin-valve film and the pinning layer 13 can be measured by X-ray diffraction. It is possible to obtain favorable orientation by designing half-value widths of rocking curves at a fcc (111) peak of the spin-valve film, and a fct (111) peak or a bcc (110) peak of the pinning layer 13 (PtMn) to 3.5 degrees to 6 degrees. Note that the orientation dispersion angle can be determined from a diffraction spot using a cross-section TEM.

Further, with the provision of the seed layer 12b, the crystal grain diameter of the spin valve film can be controlled to 5 nm to 40 nm, so that a high MR ratio can be realized without causing characteristic differences even if the size of the CCP-CPP element becomes small. Preferable grain size of spin-valve film is about 10 to 20 nm.

As a seed layer 12b, it is also possible to use $Ni_xFe_{100-x}$ (x=90% to 50%, preferably 75% to 85%) or a NiFe-based alloy such as $(Ni_xFe_{100-x})_{100-y}X_y$ (X=Cr, V, Nb, Hf, Zr, Mo) being NiFe added with a third element X to be nonmagnetic instead of using Ru. It is easily possible for the NiFe-based one rather than Ru to obtain favorable crystal orientation as a seed layer 12b, and the NiFe-based one can control the half-value width of the rocking curve measured in the same manner as above to be 3 degrees to 5 degrees. Underlayer which has bcc crystal structure such as Cr, V, W and those alloy can be also used as seedlayer 12b on buffer layer 12a such as Ta. These seedlayer 12b often does not need buffer layer 12a, so buffer layer 12a can be neglected.

In order to obtain the above-described appropriate crystal grain diameter of 5 nm to 40 nm, a composition y of the third element X is preferably in the order of 0 (zero) % to 30% (including the case where "y" equals to 0 (zero) %). In order to increase the crystal grain diameter to over 40 nm, preferably much more amount of additive element is used. For instance in the case of NiFeCr, preferably, the amount of Cr is set to approximately 35% to 45%, and a composition indicating a border facies between the fcc and bcc is used.

However, when used as a reproducing head supporting high-density recording, the element size is 100 nm or below; therefore too large crystal grain diameter sometimes cause characteristic differences in neighbor-to-neighbor devices, in which the use of large crystal grains is not so preferable. Meanwhile, when used for example as a MRAM, there may be a case where the element size is 100 nm or more, in which the seed layer 12b increasing crystal grain diameter may be used.

The film thickness of the seed layer 12b is preferably 1.5 nm to 6 nm, and more preferably 2 nm to 4 nm. The seed layer 12b having an excessively small thickness will lose its effect of controlling crystal orientation or the like. Meanwhile, the seed layer 12b having an excessively large thickness increases series resistance, and, in addition to that, sometimes causes a convex and concave in an interface of the spin-valve film.

The pinning layer 13 has a function of giving unidirectional anisotropy to the ferromagnetic layer, which is to be disposed thereon to be the pin layer 14, to fix the magnetization. As a material for the pinning layer 13, an antiferromagnetic material such as PtMn, PdPtMn, IrMn and RuRhMn can be used.

For the purpose of giving sufficiently strong unidirectional anisotropy, the film thickness of the pinning layer 13 is appropriately set. When the pinning layer 13 is PtMn or PdPtMn, the film thickness is preferably 8 nm to 20 nm, and more preferably, 10 nm to 15 nm. When the pinning layer 13 is IrMr or RuRhMn, the film thickness is preferably 4 nm to 12 nm, and more preferably 5 nm to 10 nm, since even the film having a thickness smaller than that of PtMn or the like can give unidirectional anisotropy.

The resistivity of the antiferromagnetic layer such as PtMn is approximately 100 μΩcm or more being large, in which the pinning layer 13 possibly increase series resistance, which does not directly serve to the MR ratio, which results in the increase of RA. In order to prevent the series resistance from increasing, a hard magnetic layer can be used as a pinning layer 13 instead of using the antiferromagnetic layer. As a hard magnetic layer, it is possible to use, for example, CoPt (Co=50% to 85%), $(Co_xPt_{100-x})_{100-y}Cr_y$ (x=50% to 85%, y=0% to 40%), FePt (Pt 40% to 60%) and so forth. The hard magnetic layer (in particular, CoPt) has a relatively small resistivity, allowing the series resistance and RA to be prevented from increasing.

The pin layer 14 may be a synthetic pin layer of a three-layer structure composed of a lower pin layer 141 (for example, $Co_{90}Fe_{10}$), a magnetic coupling layer 142 (for example, Ru) and an upper pin layer 143 (for example, $Co_{90}Fe_{10}$ [4 nm]). The pinning layer 13 (for example, IrMn) and the lower pin layer 141 directly thereon are coupled by exchange magnetic coupling so as to have unidirectional anisotropy. The lower pin layer 141 and the upper pin layer 143, respectively, on and under the magnetic coupling layer 142 are magnetically coupled so that the respective magnetization directions are in antiparallel with each other.

For the lower pin layer 141, for example, $Co_xFe_{100-x}$ alloy (x=0% to 100%), $Ni_xFe_{100-x}$ alloy (x=0% to 100%), or these added with the nonmagnetic element can be used.

It is preferable to design that the magnetic film thickness, namely saturation magnetization Bs×film thickness t (product of Bs maltipled by t) of the lower pin layer 141 comes to substantially the same as of the upper pin layer 143. As one example, when the upper pin layer 143 is ($Fe_{50}Co_{50}$ [1 nm]/ Cu [0.25 nm])×2/$Fe_{50}Co_{50}$ [1 nm], the saturation magnetization of FeCo is approximately 2.2 T; hence the magnetic film thickness is 2.2 T×3 nm=6.6 T nm. As for the lower pin layer 141, the saturation magnetization of $Co_{90}Fe_{10}$ is approximately 1.8 T; hence the film thickness t of the lower pin layer 141 given the same magnetic film thickness as above is 6.6 T nm/1.8 T=3.66 nm. Accordingly, it is preferable to use $Co_{90}Fe_{10}$ or $Co_{75}Fe_{25}$ of a film thickness of approximately 3.6 nm.

The film thickness of the magnetic layer used for the lower pin layer 141 is preferably in the order of 2 nm to 5 nm. This is based on an aspect of magnetic field strength of unidirectional anisotropy by the pinning layer 13 (for example, IrMn) and antiferromagnetic coupling field strength between the lower pin layer 141 and the upper pin layer 143 with Ru therebetween. When the thickness of the lower pin layer 141 is too small, the MR ratio becomes small. Meanwhile, when the thickness of the lower pin layer 141 is too large, it becomes difficult to obtain sufficient unidirectional anisotropy for a device operation.

The magnetic coupling layer 142 (for example, Ru) has a function that causes the magnetic layers thereon and thereunder the antiferromagnetic coupling to form the synthetic pin structure. The film thickness of the Ru layer as a magnetic coupling layer 142 is preferably 0.8 nm to 1 nm, or 0.3 nm to 0.5 nm. Note that it is possible to use the material other than Ru as long as the material can cause sufficient antiferromagnetic coupling for the magnetic layers thereon and thereunder (the upper pin layer 143 and the lower pin layer 141).

The upper pin layer 143 ($Co_{90}Fe_{10}$ [4 nm]) compose a part of a spin-dependent scattering unit. As an upper pin layer 143, when FeCo having the bcc structure is used instead of using $Co_{90}Fe_{10}$ having the fcc structure, larger MR ratio can be realized since the spin-dependant interface scattering effect is large. As a FeCo group alloy having the bcc structure, there are $Fe_xCo_{100-x}$ (x=30% to 100%) and $Fe_xCo_{100-x}$ added with an additive element. The metal materials used for the spin-valve film frequently have the fcc structure or the fct structure, therefore there may be a case where only the upper pin layer 143 has the bcc structure.

When the film thickness of the upper pin layer 143 is too small, it is difficult to stably maintain the bcc structure and becomes impossible to obtain a high MR ratio, therefore, the film thickness of the upper pin layer 143 is preferably 2 nm or more. Meanwhile, in order to obtain a large pin fixing magnetic field, the film thickness of the upper pin layer 143 is preferably 5 nm or below.

When the upper pin layer 143 is formed by the magnetic layer having the bcc structure that can realize a higher MR ratio, the film thickness of the layer having the bcc structure is preferably 2 nm or more to stably maintain the bcc structure. In order to realize both the larger pin fixing magnetic field and the stability in the bcc structure together, the film thickness of the layer having the bcc structure is preferably in the order of 2 nm to 4 nm. As for the magnetic film of the FeCo group, as such a composition range in a phase diagram that can obtain more stable bcc structure, a range for $Fe_xCo_{100-x}$ (x=30-100) can be used.

For the upper pin layer 143, a CoFe alloy having the fcc structure or a cobalt alloy having the hcp structure can be used instead of using the magnetic material having the bcc structure. Any element metals such as Co, Fe, Ni and the like and the alloy material containing any one of these element metals can be used. When sequentially listing the materials that obtain a larger MR ratio as a magnetic material for the upper pin layer 143 in the order from the highest potential; the alloy material having the bcc structure, the cobalt alloy containing 50% or more cobalt, and a nickel alloy containing 50% or more nickel.

It is possible to prevent the STI noise by inserting the damping-factor (DF) adjustment layer 21 into the upper pin layer 143. This will be detailed later.

The lower metal layer 15 is used when forming a current path 162, which is a supply source of the current path 162, from a different perspective. However, the lower metal layer 15 does not necessarily remain definitely as a metal layer after the current path 162 is formed.

The NOL with CCP 16 includes an insulating layer 161 and the current path 162. Note that the NOL with CCP 16, lower metal layer 15 and upper metal layer 17 can be treated as a spacer layer, as a whole.

The insulating layer 161 is composed of oxide, nitride, oxynitride and the like, and includes $Al_2O_3$ formed by amorphous or those having crystal structure such as MgO, as the case may be.

As typical insulating materials used for the insulating layer 161, there are those based on $Al_2O_3$ and those based on $Al_2O_3$ added with an additive element. As an additive element, there are Ti, Hf, Mg, Zr, V, Mo, Si, Cr, Nb, Ta, W, B, C and the like. It is possible to use these additive elements appropriately by changing their ratios within the approximate range from 0 (zero) % to 50%.

For the insulating layer 161, it is possible to use Ti-oxide, Hf-oxide, Mg-oxide, Zr-oxide, Cr-oxide, V-oxide, Ta-oxide, Nb-oxide, Mo-oxide, Si-oxide or the like, instead of using Al-oxide such as $Al_2O_3$. In the case of these oxides, it is also possible to use materials as described above as an additive element. Further, in view of the amount of the additive element, it is possible to use by appropriately changing their ratios within the approximate range from 0 (zero) % to 50%. In stead of using these oxides, it is possible to use oxynitride or nitride based on Al, Si, Hf, Ti, Mg, Zr, V, Mo, Nb, Ta, W, B, or C as described above.

The current path 162 is to confine current and functions as an electric conductor passing current in the layer direction of the insulating layer 161, and can be mainly composed of a nonmagnetic metal such as Cu, as an example. With the current-confined-path effect, it is possible to increase the MR ratio.

The current path 162 is an area exhibiting extremely small oxygen content or nitrogen content as compared to the insulating layer 161 (comparison of the oxygen content or nitrogen content with that of the insulating layer 161 shows at least double or more), and is generally a crystal phase. Crystal phase has a smaller resistance than an amorphous phase, so that the crystal phase can serve as a current path 162 more easily.

The upper metal layer 17 has a function as a barrier layer protecting the free layer 18 to be deposited thereon from oxidization due to contact with the oxide of the spacer layer 16. Note that the upper metal layer 17 is not a must since the oxidization of the free layer 18 is avoidable by optimizing annealing conditions or the like. However, in consideration of a production margin, preferably, the upper metal layer 17 is formed on the spacer layer 16.

In addition to Cu, as a component material for the upper metal layer 17, Au, Ag, Al or the like can also be used. Preferably, the material for the upper metal layer 17 is the same as of the current path 162 of the spacer layer 16. When the material of the upper metal layer 17 is not the same as of the current path 162, a resistance at the interface increases, whereas when both of them are the same, the resistance at the interface does not increase.

The film thickness of the upper metal layer 17 is preferably 0 (zero) nm to 1 nm, and more preferably, 0.1 nm to 0.5 nm. When the upper metal layer 17 has too large thickness, the current confined in the spacer layer 16 is released in the upper metal layer 17, in which the current-confined-path effect becomes insufficient to thereby lower the MR ratio.

The free layer 18 is a layer having ferromagnetic material of which magnetization direction changes depending on the external magnetic field, and for example, three layers of $Co_{90}Fe_{10}$ [1 nm]/$Ni_{83}Fe_{17}$ [3.5 nm] using NiFe with CoFe inserted between the interface can be used. In order to obtain a higher MR ratio, the selection of the magnetic material for the free layer 18 positioning at the interface with the spacer layer 16 is important. In this case, at the interface with the spacer layer 16, preferably, a CoFe alloy is provided rather than a NiFe alloy. Note that $Co_{90}Fe_{10}$ [4 nm] single free layer can be used when the NiFe layer is not used.

Out of the CoFe alloys, $Co_{90}Fe_{10}$ is preferable because of its stable soft magnetic characteristic. When using the CoFe alloy very close to $Co_{90}Fe_{10}$, the film thickness is preferably set to 0.5 nm to 4 nm. Also, as a free layer 18, it is possible to use alternately stacked plural layers composed of the CoFe layer or a Fe layer of a film thickness of 1 nm to 2 nm and a Cu layer of an extremely small film thickness of approximately 0.1 nm to 0.8 nm.

Similarly, in the case of the free layer 18, as in the case of the pin layer 14, a FeCo alloy of bcc can be used instead of using a CoFe alloy of fcc as a material for the interface with the spacer 16, since when the spacer layer 16 is formed by a Cu layer, the MR ratio increases when the FeCo layer of bcc is used as a material for the interface with the spacer layer 16. In this case, $Fe_xCo_{100-x}$ (x=30 to 100) or the same added with an additive element, which tends to form a bcc layer, can also be used.

Here, it is possible to prevent the STI noise by inserting the damping-factor (DF) adjustment layer 21 into these free layers 18. This will be detailed later.

The capping layer 19 has a function of protecting the spin-valve film. The capping layer 19 may be structured, for example, by plural metal layers; for example, a two-layer structure composed of a Cu layer and a Ru layer is possible. At this time, the film thickness of the Cu layer is preferably in the order of 0.5 nm to 10 nm. Further, the film thickness of the Ru layer can be set in the order of 0.5 nm to 10 nm.

It is possible to provide the Ru layer of a thickness of approximately 0.5 nm to 10 nm directly on the free layer 18 as the capping layer 19 without using the Cu layer. Further, it is possible to provide another metal layer instead of providing the Ru layer. The composition of the capping layer 19 is not specifically limited, and the other material can be used as long as it can protect the spin-valve film as a cap.

The upper electrode 20 is an electrode to pass current through the spin-valve film in the direction perpendicular to the spin-valve film. With a voltage application to between the lower electrode 11 and the upper electrode 20, the current flows inside the spin-valve film along the direction perpendicular to the film.

(Details of Damping-Factor (DF) Adjustment Layer 21)

The damping-factor adjustment layer 21 is a layer to reduce the STI noise. As previously described, the STI noise is generated by a torque acting to move the magnetization direction. With the flow of electrons having spin torque (in short, electrons having magnetization information of a magnetic layer) from the pin layer 14 to the free layer 18 or vice versa, the toque making the magnetization information be in parallel or antiparallel to each other is generated to cause the noise. It is effective for the STI noise reduction to prevent such a torque acting to move the magnetization direction (or to stabilize the magnetizing torque caused by current pass). A parameter indicating damping with respect to this torque is a damping factor.

In the present embodiment, it is possible to increase the damping factor to reduce the STI noise and thereby keep the MR ratio to be at large value. As a specific approach, for example, a Pt layer of an ultrathin thickness of approximately 0.5 nm is inserted into the magnetic layer of the CCP-CPP spin-valve film as a damping-factor adjustment layer 21. With this, a spin transfer torque phenomenon is prevented, and, as a result, the STI noise is prevented.

Here, as a damping-factor adjustment layer 21, the use of an ultrathin layer of an atomic element having larger atomic number or of nonmagnetic 3d transition metal is effective in increasing the damping factor. The damping-factor adjustment layer 21 is inserted into the pin layer 14 or the free layer 18.

However, it has a risk to cause an undesirable result to interfuse the magnetic layer of a normal metal CPP spin-valve film with a material of a large atomic number. Specifically, when the material of a large atomic number is interfused into the magnetic layer, a GMR effect falls due to a spin orbit interaction. Among others, in the case of the metal CPP spin-valve film, the GMR effect is affected remarkably. This is because, although there are spin-dependent interface scattering effect and spin-dependent bulk scattering effect in the CPP-GMR, the spin-dependent bulk scattering effect is predominant in the case of the normal CPP spin-valve film.

The spin-dependent interface scattering effect is the GMR effect at the interface between the spacer layer 16 and pin layer 14 or the free layer 18, being a phenomenon caused only in the vicinity of the interface. Meanwhile, the spin-dependent bulk scattering effect is the GMR effect caused inside the magnetic layer of the pin layer 14 or the free layer 18. The spin-dependent bulk scattering effect is a phenomenon caused only in the magnetic layer, therefore the magnetic layer having larger film thickness has larger spin-dependent bulk scattering effect and thereby has the larger MR ratio.

In the normal metal CPP spin-valve film, the GMR phenomenon caused by the spin-dependent interface scattering effect is small, and almost all the GMR effect is ascribable to the spin-dependent bulk scattering effect (nonpatent document 3: H. Yuasa et al., J. Appl. Phys. 92 (5), 2646 (2002)). This fact can be understood from FIG. 5 of nonpatent document 3, in which AdR (area resistance change) at such a portion of the magnetic layer that has a larger film thickness is substantially large as compared to the AdR at such a portion of the magnetic layer that has a film thickness of almost zero (0) (this value corresponds to the spin-dependent interface scattering effect) (the portion of the magnetic layer having a larger film thickness is to experience sum of the spin-dependent interface scattering effect and the spin-dependent bulk scattering effect).

Accordingly, in the normal metal CPP spin-valve film, the contribution of the spin-dependant bulk scattering effect is extremely larger. Therefore, it is unfavorable to interfuse the material of a large atomic number into the magnetic layer in that the material reduces the spin-dependent bulk scattering effect and thereby reduces the MR ratio to consequently reduce the output of the head. Specifically, it is difficult to realize both the low STI noise and high output together. As described above, for the metal CPP spin-valve film having the normal metal spacer layer 16, it is hard to say that the infusion of the element of larger atomic number into the magnetic layer of the pin layer 14 or the free layer 18 is a favorable approach.

Meanwhile, in the CCP-CPP spin-valve film, the spin-dependent interface scattering effect is extremely large as compared to the spin-dependent bulk scattering effect (nonpatent document 4: H. Fukuzawa et al., Appl. Phys. Lett. 87, 082507 (2005)). This is ascribable to the fact that the contributing ratio of the CCP portion to total resistance of the spin-valve film is extremely large and thereby the interface effect affects largely in the vicinity of the CCP. In other words, in the CCP-CPP spin-valve film, even if degradation of some spin-dependent bulk scattering effect comes arises, the MR ratio is not directly lowered as long as the spin-dependent interface scattering effect remains effective. Therefore, it is possible to realize both the low STI noise and high MR ratio simultaneously. Based on the above reason, in the CCP-CPP element, with the use of the damping-factor adjustment layer 21, it is enabled to prevent the STI noise without sacrificing the MR.

As a damping-factor adjustment layer 21, in addition to Pt, the materials having a relatively large atomic number such as Zr, Nb, Mo, Ru, Rh, Pd, Ag, La, Hf, Ta, W, Re, Os, Al, Mg, Ir and Au, and nonmagnetic 3d transition metal such as Ti, V, Cr and Mn can be used.

When inserting the relatively thicker nonmagnetic material as a damping-factor adjustment layer, the magnetic coupling in the pin layer 14 or in the free layer 18 (namely, between the upper and lower magnetic layers sandwiching the damping-factor adjustment layer 21) might be decoupled. In order to keep the magnetic coupling via the damping-factor adjustment layer 21 to be a sufficiently large value, as a film thickness of the damping-factor adjustment layer 21, 0.1 nm to 1 nm is preferable, and 0.1 nm to 0.7 nm is more preferable.

It is possible that the damping-factor adjustment layer 21 is inserted into either the pin layer 14 or the free layer 18.

It is not desirable to insert the damping-factor adjustment layer 21 into the vicinity of the spacer layer 16 since the MR ratio falls thereby. It is therefore favorable to insert the damping-factor adjustment layer 21 at a portion that is, at least, 1 nm or more distant from the spacer layer 16. Specifically, in consideration of the influence to the MR ratio, the damping-factor adjustment layer 21 is disposed at a position which is to some extent distant from the spacer layer 16.

In this manner, the damping-factor adjustment layer 21 is disposed at a position being approximately 1 nm distant from the vicinity of the interface with the spacer layer 16, so that the damping factor can be prevented without adversely affecting the spin-dependent interface scattering effect. In other word, in the case of the CCP-CPP, the STI noise can be prevented efficiently without damaging in return the MR ratio.

Depending on the material, the damping-factor adjustment layer 21 can be inserted even into a region having a distance of below 1 nm from the vicinity of the interface with the spacer layer 16. Specifically, when Ti, Zr, Pd, Nb, Al, Mg or the like is used as the damping-factor adjustment layer 21, it is possible to insert the damping-factor adjustment layer 21 into the region having a distance of below 1 nm from the interface with the spacer layer 16 in that the spin-dependent interface scattering effect is relatively not affected thereby. More specifically, the position having a distance below 1 nm from the interface with the spacer layer 16 (namely, a position 0 (zero) nm distant from the interface) can be used as a position for the insertion. Needless to say, these materials can be inserted into any position that is more distant from the above and so forth. These materials such as Ti, Zr, Pd, Nb, Al, Mg and the like are convenient materials for the damping-factor adjustment layer 21 in that they have lesser effect on the MR ratio.

It is possible to insert a plurality of damping-factor adjustment layers 21 into the magnetic layer such as the pin layer 14 and the free layer 18. In that case, the first layer is inserted into a position distant below 1 nm from the spacer layer 16 when the above-described materials such as Ti, Zr, Pd, Al or Nb is used, and the first layer is inserted into a position 1 nm or more distant from the spacer layer 16 when the material is the other element such as Pt. Then, a layer to be stacked thereafter such as the second layer, the third layer or the like is to be inserted into a position more distant from the spacer layer 16 as compared with the first layer. The distance between these first layer and second layer, or the distance between the second layer and the third layer is preferably in the order of 1 nm to 2 nm. However, when a thicker magnetic layer is used, larger distance may be acceptable.

As a benefit of using plural damping-factor adjustment layers 21 in the free layer 18 or the pin layer 14, a damping-factor adjustment effect, and consequently, a noise reduction effect can be cited. The plural damping-factor adjustment layers 21 may be inserted into either the pin layer 14 or the free layer 18, and also the plural damping-factor adjustment layer 21 may be inserted into both the pin layer 14 and the free layer 18 to make both the layers have a stacked layer structure.

As a demerit of using the plural damping-factor adjustment layers 21, a possible magnetic characteristic degradation due to a reduction in the MR ratio and a weaken magnetic coupling between the magnetic layers via the damping-factor adjustment layer 21 might happen. In order to avoid such a demerit, a total film thickness of the damping-factor adjustment layers 21 in the free layer 18, or in the pin layer 14 is preferably the same as in the case of the single-layer structure. Further, as a distance between the plural damping-factor adjustment layers 21 in a single magnetic layer, as described above, a range from 1 nm to 2 nm is preferable.

Here, it is conceivable to select a material (for example, an alloy material) that can prevent an ST effect as a component material itself for the magnetic layers (pin layer 14, free layer 18) instead of using the damping-factor adjustment layer 21 as in the present embodiment. However, in that case, the MR ratio lowers. In the CPP spin-valve film having the CCP structure, the MR effect in the vicinity of the interface with the spacer layer 16 is large, so that an existence of an additive element reducing the MR ratio in the vicinity of the interface is undesirable. It is possible to prevent the ST effect by using a magnetic material not damaging the MR increase in the vicinity of the interface with the spacer layer 16 and by inserting an ultrathin layer (damping-factor adjustment layer 21) into inside the magnetic layer(s) (pin layer 14, free layer 18). With this, the prevention of the ST effect and the maintenance of the MR ratio can be realized together.

Hereinafter, the description will be given of comparative examples in comparison with the present invention.

A. Comparison with a Case where Pt is Added to the Entire Magnetic Layer.

As a comparative example, the case where Pt is added to the entire magnetic layer will be considered. When Pt is added to an entire stacked magnetic layer used as a free layer 18 such as CoFe/NiFe, it becomes the free layer 18 of CoFePt/NiFePt. In this case, the damping factor increases so that the STI noise can be prevented. Meanwhile, however, the MR ratio lowers to cause the output of the head to fall. Specifically, although the MR ratio is 9% in the case of the free layer not added with Pt, the MR ratio becomes down to 4% in the case of the free layer added with Pt, indicating a large MR ratio degradation.

Meanwhile, in the present embodiment, by inserting the ultrathin layer of Pt into a position slightly distant from the interface of the CCP, the damping factor adjustment effect can be obtained while keeping a large spin-dependent interface scattering effect. Specifically, when an ultrathin Pt layer of a thickness of approximately 0.5 nm is inserted into a NiFe layer, the STI noise can be prevented to a large extent, even though the MR ratio shows a slight down to 8.5% being not a large down. Specifically, in the present embodiment, the benefit of the improvement in the S/N ratio obtained by the noise reduction is larger than the effect of the slight reduction of the output signal caused by the slight MR ratio down, so that a favorable characteristic can be obtained as a result of a BER (Bit Error Rate) down.

B. Comparison with a Case where a Metal CPP Spin-Valve Film is Adopted.

In the case of the metal CPP spin-valve film not having the CCP structure, the spin-dependent interface scattering effect is not the main, and the spin-dependent bulk scattering effect serves to a great degree. Therefore, even when the ultrathin Pt layer is inserted into a position distant from the interface of the spacer layer 16, the MR ratio falls and the film cannot serve as a damping-factor adjustment layer 21.

A specific example will be given. In the case of a normal metal CPP spin-valve film with a Cu spacer layer of a thickness of nm and without a CCP spacer layer and it is a standard CoFe/NiFe free layer, the MR ratio is 2%. At this time, when an ultrathin Pt layer of a thickness of 0.5 nm or the like is inserted into the NiFe layer, the MR ratio falls to 1%. In the case of the simple metal CPP spin-valve film, the original MR ratio itself is a small value in the range from 1% to 3%, in which sufficient output as a magnetic head is difficult to be obtained. Therefore, the degradation amount of the MR ratio caused by the insertion of the damping-factor adjustment layer 21 into this metal CPP spin-valve film is larger as compared to the case of the CCP-CPP. Therefore, from the viewpoint of a total performance, it is difficult to use the ultrathin Pt layer as a damping-factor adjustment layer 21 for the metal CPP spin-valve film.

As described above, a combination of the CCP spin-valve film and the damping-factor adjustment layer 21 can bring a large effect.

C. Effect of Changing the Damping-Factor Adjustment Layer 21

Effect of changing the damping-factor adjustment layer 21 while fixing the CCP-CPP spin-valve film being a base to the MR ratio will be considered.

As compositions of the pin layer 14, the spacer layer 15, 16 and 17, and the free layer 18 that largely affect the MR ratio, those as will be described below are employed for consideration. First, as a pin layer 143, a stacked layer being $Fe_{50}Co_{50}$ of a thickness of 2 nm to 3 nm having ultrathin Cu layers each having a thickness of 0.2 nm for every 1 nm thickness of FeCo is used. The spacer layer 16 is defined to be a spacer layer 16 of a thickness of 1.5 nm to 2 nm that uses $Al_2O_3$ having the CCP structure as an insulating layer and Cu as a metal path. For a free layer 18, CoFe 1 nm/NiFe 3.5 nm is defined to be the basic composition of the film.

FIG. 7 below shows dependencies of the damping-factor adjustment layer 21 on the materials and the inserted position when the damping-factor adjustment layer 21 is used in such a CCP-CPP spin-valve film.

FIG. 7 shows dependencies of the MR ratio on the materials and the inserted positions (distances: distances from the CCP interface) when the damping-factor adjustment layer 21 is inserted only into the free layer 18. Note that the comparative example 0 (zero) shows the case without the damping-factor adjustment layer 21.

As is understood from FIG. 7, when a standard damping-factor adjustment layer 21 such as of Pt is inserted into the interface of the spacer layer 16, the MR ratio falls largely, which cannot be said effective. Under normal conditions. It is desirable to insert the damping-factor adjustment layer 21 at a portion that is 1 nm or more distant from the interface of the spacer layer 16.

Meanwhile, when the damping-factor adjustment layer 21 is of Ti, Zr, Pd, Al, or Hf, even if it is inserted into the vicinity of the interface of the spacer layer 16, the MR ratio fall is relatively small, allowing it to be used in the vicinity of the interface. However, from the viewpoint of the MR ratio, it is desirable to insert it into inside the magnetic layer rather than the interface in that the insertion into the magnetic layer affects less the MR ratio.

Depending on actual STI noise conditions, whether it is provided in the vicinity of the interface or inside the magnetic layer is optimized. Since the free layer 18 assumes magnetization response to the medium magnetic field and the magnetization of the pin layer 14 is fixed without regard to the direction of the medium magnetic field, the insertion of the damping-factor adjustment layer 21 into the free layer 18 is effective to reduce the STI noise. Hence, as in examples 1 to 11, it is preferable to insert into the free layer 18 as a configuration realizing both the MR ratio and the STI noise reduction together.

Examples 21 to 34 in which the damping-factor adjustment layer 21 is inserted only into the pin layer 14 are shown in FIG. 8. Also, in this case, the dependencies on the materials are qualitatively the same as of the examples 1 to 11 However, in the case of the pin layer 14, since a large bcc-FeCo is used, the spin-dependent interface scattering effect increases to a large degree. Therefore, the damage to the MR ratio to lower caused by the insertion of the damping-factor adjustment layer 21 increases larger as compared to the case of the free layer 18.

Examples 41 to 54 in which the damping-factor adjustment layer 41 is inserted into both the pin layer 14 and the free layer 18 are shown in FIG. 9. The tendency is the same as of the above, and the MR ratio falls relatively largely as compared to the case where the insertion is performed either the pin layer 14 or the free layer 18, however, the STI noise preventive effect increases.

(Manufacturing Method of Magneto-Resistance Effect Element)

Hereinafter, a manufacturing method of the magneto-resistance effect film according to the present embodiment will be described in more detail.

Figure 2:
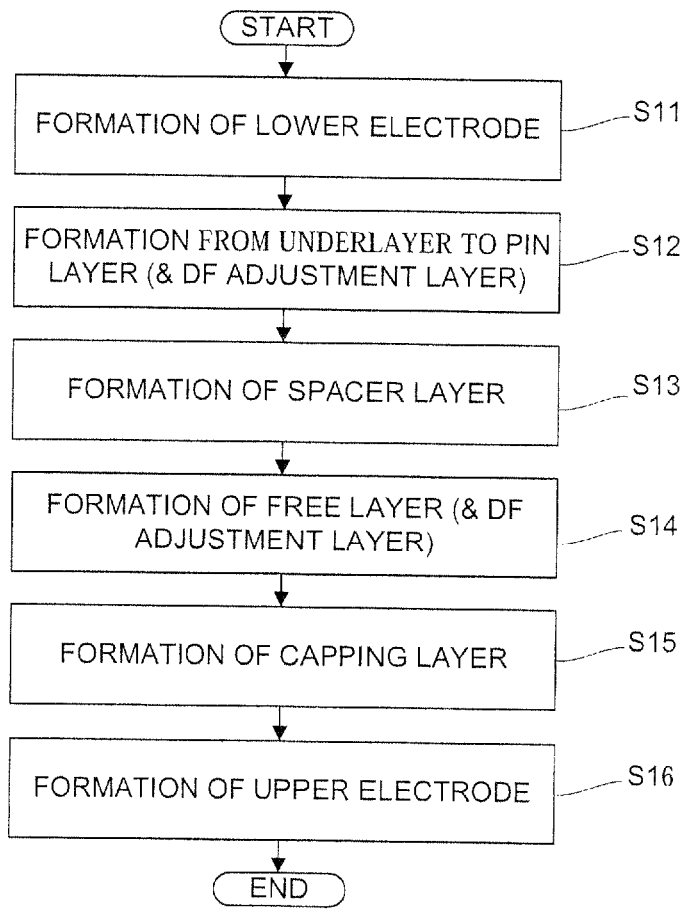
FIG. 2 is a flowchart showing a production process of the magneto-resistance effect element according to the first embodiment of the present invention.
Figure 3:
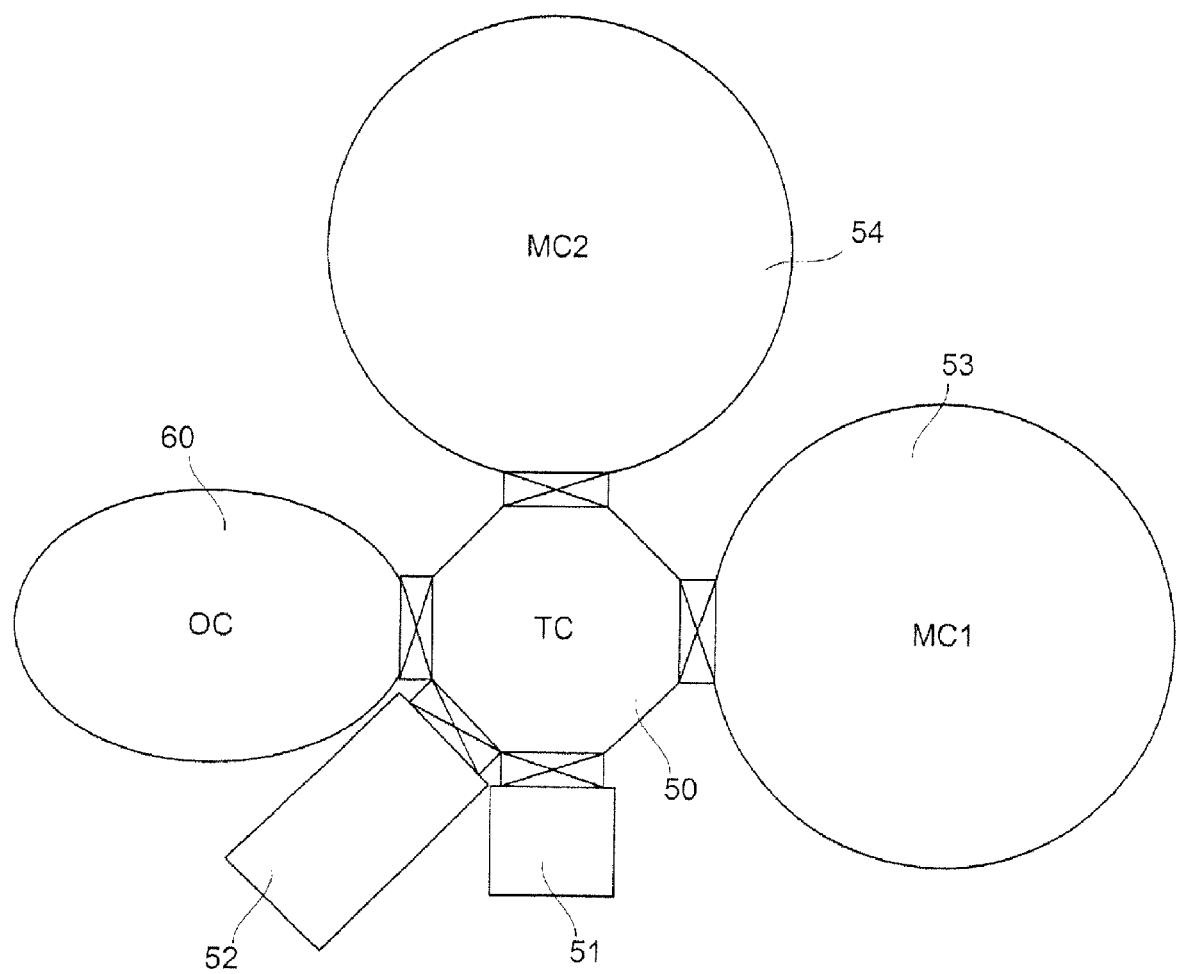
FIG. 3 is a schematic diagram showing a schematic view of a deposition apparatus used to manufacture magneto-resistance effect elements.

FIG. 2 is a flow chart showing a production process of the magneto-resistance effect element according to the first embodiment of the present invention. FIG. 3 is a schematic diagram schematically showing a deposition apparatus used in the manufacturing of the magneto-resistance effect element. Further, FIG. 4 is a schematic view showing an oxidization chamber 60 in the deposition apparatus.

As shown in FIG. 3, a load lock chamber 51, a precleaning chamber 52, a first metal deposition chamber (MC1) 53, a second metal deposition chamber (MC2) 54 and an oxidization chamber (OC) 60 are provided around a transportation chamber (TC) 50 respectively via a gate valve. This deposition apparatus allows a substrate to be transported in vacuum to/from the respective chambers each connected via the gate valve, so that the surface of the substrate can be kept to be clean.

The metal deposition chambers 53, 54 are multitarget (5 targets to 10 targets). As deposition methods, sputtering methods such as a DC magnetron sputtering method and a RF magnetron sputtering method, an ion-beam sputtering method, a vapor deposition method, and the like can be cited.

Figure 4:
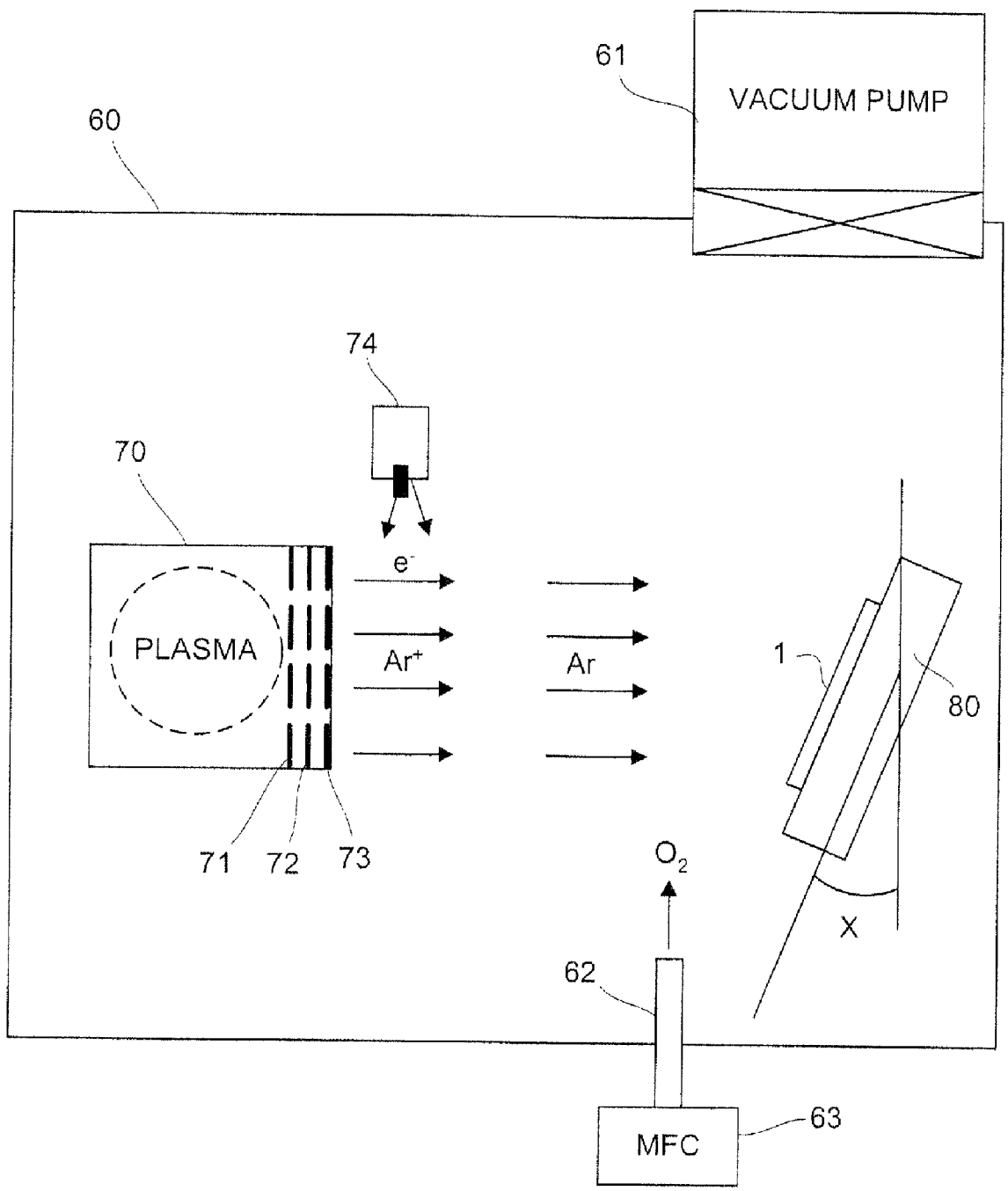
FIG. 4 is a schematic diagram showing a structure of an oxidation chamber.

As shown in FIG. 4, the oxidization chamber 60 is evacuated by a vacuum pump 61, and oxygen gas after flow control by a mass flow controller (MFC) 63 is introduced into the oxidization chamber 60 via an oxygen supply tube 62.

In the oxidization chamber 60, an ion source 70 is provided. As types of the ion source, there are an ICP (Inductive coupled plasma) type, a Capacitive coupled plasma type, an ECR (Electron-cyclotron resonance) type and a Kauffman type.

A substrate holder 80 and a substrate 1 are disposed to face with the ion source 70. Three pieces of grids 71, 72, 73 adjusting ion acceleration are provided at an ion-emission hole side of the ion source 70. Outside of the ion source 70, a neutralizer 74 neutralizing ion is provided. The substrate holder 80 is inclinably supported. The incident angle of the ion with respect to the substrate 1 is changeable in a wide range, however, a typical incident angle thereto is 15 degrees to 60 degrees.

Hereinafter, the production process of the magneto-resistance effect element will be described.

The lower electrode 11, the underlayer 12, the pinning layer 13, the pin layer 14, the lower metal layer 15, the NOL with CCP 16, the upper metal layer 17, the free layer 18, the capping layer 19 and the upper electrode 20 are sequentially formed on a substrate (not shown). Note that this formation sequence can be reversed.

The substrate is set to the load lock chamber 51, and the metal deposition chamber 53 performs a metal deposition and the oxidization chamber 60 performs oxidization, respectively. The degree of vacuum the metal deposition chamber achieves is preferably $1\times10^{-8}$ Torr or below, and generally in the order of $5\times10^{-10}$ Torr to $5\times10^{-9}$ Torr. The degree of vacuum the transportation chamber 50 achieves is in the order of $10^{-9}$ Torr. The degree of vacuum the oxidization chamber 60 achieves is $8\times10^{-8}$ Torr or below.

(1) Formation of Lower Electrode 11, Underlayer 12, Pinning Layer 13, and Pin Layer 14 (and Damping-Factor Adjustment Layer 21) (Step S11 and S12)

The lower electrode 11 is formed on the substrate (not shown).

On the lower electrode 11, for example, Ta [5 nm]/Ru [2 nm] is deposited as a underlayer 12. As previously described, Ta is the buffer layer 12a such as to ease roughness of the lower electrode. Ru is the seed layer 12b controlling the crystal orientation and crystal grain diameter of the spin-valve film to be deposited thereon.

The pinning layer 13 is deposited on the underlayer 12. As a material for the pinning layer 13, the antiferromagnetic material such as PtMn, PdPtMn, IrMn, RuRhMn or the like can be used.

The pin layer 14 is formed on the pinning layer 13. The pin layer 14 may be a synthetic pin layer composed, for example, of the lower pin layer 141 ($Co_{90}Fe_{10}$), the magnetic coupling layer 142 (Ru) and the upper pin layer 143 ($Co_{90}Fe_{10}$ [4 nm]).

The damping-factor adjustment layer 21 can be inserted in the course of the deposition of the upper pin layer 143 by switching the material for the deposition. Specifically, the deposition material is switched from $Co_{90}Fe_{10}$ to Pt and switched back again to $Co_{90}Fe_{10}$ so that the damping-factor adjustment layer 21 made of Pt is inserted into the upper pin layer 143.

(2) Formation of Spacer Layer 16 (Step S13)

Next, the CCP-NOL is formed. The oxidization chamber 60 is used to form the spacer layer 16.

A method as will be described below is used to form the spacer layer 16. Here, a case where the spacer layer 16 including the current path 162 made of Cu having a metal crystal structure is formed in the insulating layer 161 made of $Al_2O_3$ having an amorphous structure will be described as an example.

1) The lower metal layer 15 (for example, Cu) to be a supply source of the current path is deposited on the upper pin layer 143, and after that, a metal layer to be oxidized (for example, AlCu or Al) that is converted into an insulating layer is deposited on the lower metal layer 15. An ion beam of rare gas (for example, Ar) is irradiated prior to the oxidation, which is called a PIT (Pre-ion treatment). As a result of the PIT, it is placed under a state where parts of the lower metal layer are sucked up to enter into the metal layer to be oxidized.

2) Oxidize the metal layer to be oxidized by supplying oxidation gas (for example, oxygen). With this oxidization, the metal layer to be oxidized is converted into the insulating layer 161 made of $Al_2O_3$ and at the same time the current path 162 passing through the insulating layer 161 is formed, so that the spacer layer 16 is formed. For example, the metal gas to be oxidized is oxidized (IAO: Ion beam-assisted Oxidation) by supplying oxidation gas (for example, oxygen) while emitting the ion beam of rare gas (Ar, Xe, Kr, He, or the like). With this oxidation treatment, the spacer layer 16 in form that $Al_2O_3$ being the insulating layer 161 and Cu being the current path 162 are separated is formed. The treatment is taking advantage of a difference in the oxidation that Al is oxidized easily and Cu is difficult to be oxidized.

(3) Formation of Upper Metal Layer 17, Free Layer 18 (and Damping-Factor Adjustment Layer 21) (Step S14)

On the spacer layer 16, as an upper metal layer 17, for example, Cu [0.25 nm] is deposited. The free layer 18, for example, $Co_{90}Fe_{10}$ [1 nm]/$Ni_{83}Fe_{17}$ [3.5 nm] is formed on the upper metal layer 17. The damping-factor adjustment layer 21 can be inserted in the course of the deposition of the free layer 18 by switching the deposition material. Specifically, the deposition material is switched from $Ni_{83}Fe_{17}$ to Pt and switched back again to $Ni_{83}Fe_{17}$, so that the damping-factor adjustment layer 21 made of Pt is inserted into $Ni_{83}Fe_{17}$ of the upper pin layer 18.

(4) Formation of Capping Layer 19 and Upper Electrode 20 (Step S15 and S16)

On the free layer 18, for example, Cu [1 nm]/Ru [10 nm] is stacked as a capping layer 19. The upper electrode 20 to pass current through the spin-valve film in the direction perpendicular thereto is formed on the capping layer 19.

Example

As an example of the present invention, a configuration as will be described below can be cited. In this example, as a damping-factor adjustment layer 21, a Pt layer of a thickness of 0.5 nm is disposed in the upper pin layer 143 and in the free layer 18 of $Fe_{50}Co_{50}$, respectively. With the use of the damping-factor adjustment layer 21, the STI noise can be prevented while keeping the high MR ratio in the range from 8% to 15% at RA of 300 mm² to 1000 mm².

Lower electrode 11
Underlayer 12: Ta [5 nm]/Ru [2 nm]
Pinning layer 13: $Pt_{50}Mn_{50}$ [15 nm]
Pin layer 14: $Co_{90}Fe_{10}$ [4 nm]/Ru [0.9 nm]/$Fe_{50}Co_{50}$ [2 nm]/Pt 0.5 nm/$Fe_{50}Co_{50}$ [2 nm]
Spacer layer 15, 16, and 17
Lower metal layer 15: Cu [0.5 nm]
CCP-NOL 16: the current path 162 composed of the insulating layer 161 made of $Al_2O_3$ and Cu ($Al_{90}Cu_{10}$ [0.9 nm] is deposited to be subject to the oxidization treatment)
Lower metal layer 17: Cu [0.25 nm]
Free layer 18: $Co_{90}Fe_{10}$ [1 nm]/$Ni_{83}Fe_{17}$ [1 nm]/Pt [0.5 nm]/$Ni_{83}Fe_{17}$ [1 nm]
Capping layer 19: Cu [1 nm]/Ru [10 nm]
Upper electrode 20

Second Embodiment

Figure 5:
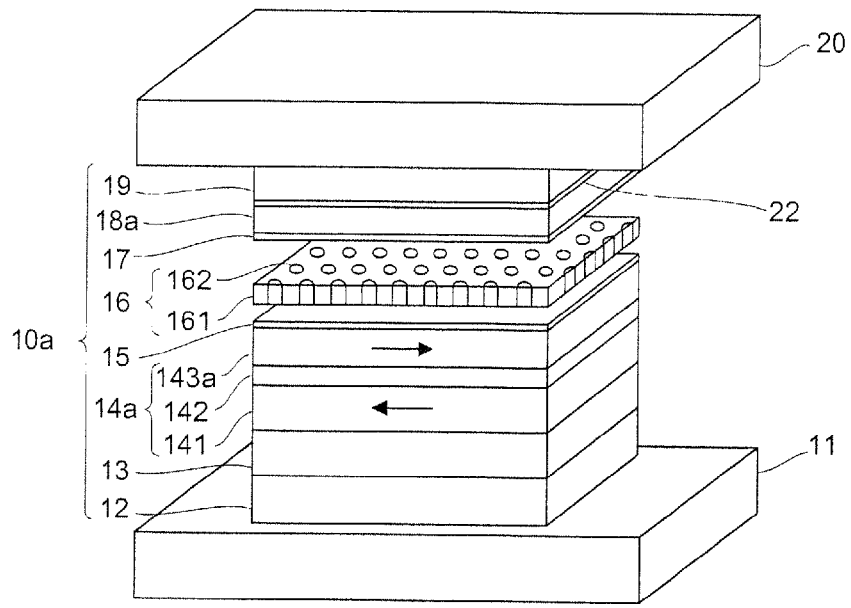
FIG. 5 is a perspective view showing a magneto-resistance effect element according to a second embodiment of the present invention.

FIG. 5 is a perspective view showing a magneto-resistance effect element (CCP-CPP element) according to a second embodiment of the present invention.

As shown in FIG. 5, the magneto-resistance effect element according to the present embodiment includes a magneto-resistance effect film 10a, and the lower electrode 11 and the upper electrode 20 sandwiching the magneto-resistance effect film 10a from above and below; and is configured on a not-shown substrate.

The magneto-resistance effect film 10a is composed of the underlayer 12, the pinning layer 13, a pin layer 14a, the lower metal layer 15, the spacer layer (CCP-NOL) 16, the upper metal layer 17, a free layer 18a, and the capping layer 19, which are sequentially stacked. The magneto-resistance effect film 10a is not different from the magneto-resistance effect film 10 in nature, therefore, detailed description of these underlayer 12 to capping layer 19 will be omitted.

In the present embodiment, the STI noise is reduced by disposing a diffusive electron scattering layer (DESL: Diffusive Electron Scattering Layer) 22 on the interface on the free layer 18a (boundary between the free layer 18a and the capping layer 19). Differently from the first embodiment, the diffusive electron scattering layer 22 is not disposed on the pin layer 14a.

The diffusive electron scattering layer 22 is a layer disposed under the capping layer 19 and scattering diffusive electrons. With the scattering of diffusive electrons by the diffusive electron scattering layer 22, electron reflection on an outside interface (the interface opposite to the spacer layer 16) of the ferromagnetic layer (free layer 18a) is restricted, so that the ST effect, and consequently, the STI noise can be prevented. Note that it is possible to consider the diffusive electron scattering layer 22 by including it into the capping layer 19.

(1) The diffusive electron scattering layer 22 can be composed of a nonmagnetic amorphous material. The amorphous structure of the nonmagnetic amorphous material diffusely scatters electrons to prevent the STI noise.

As a nonmagnetic amorphous material, an element metal such as Ta, Ti, Zr, Hf, Nb, B, Si, W or the like, or an alloy material containing these elements at a ratio of at least 50% or more can be used. As a nonmagnetic amorphous material, an amorphous material composed of an alloy such as AlB, AlSiB, AlSi or the like may be used as well.

The STI noise is prevented by making use of the diffusive electron scattering based on the amorphous structure of the nonmagnetic amorphous material, so that it is not preferable that the diffusive electron scattering layer 22 has the crystal structure. In order to prevent the diffusive electron scattering layer 22 from crystallizing, the diffusive electron scattering layer 22 is preferably thin to some extent. In addition, also from the viewpoint of a smaller gap, the diffusive electron scattering layer 22 is preferably thin to same extent. Specifically, as a thickness of the diffusive electron scattering layer 22, 0.5 nm to 5 nm is preferable, and 1 nm to 3 nm is more preferable.

(2) Further, the diffusive electron scattering layer 22 can be composed of a mixing layer. The mixing layer causes the diffusive electron scattering and thereby the STI noise can be prevented.

The mixing layer can be formed on the interface between two stacked layers formed. Specifically, at least two or more kinds of alloy materials which are in a relation of solid solution with each other are stacked by being divided into two layers, and the mixing layer being a solid solution can be formed on their interface. As a combination of materials which are the solid solution to each other, there is Cu and Al (CuAl alloy is formed), Cu and Ni (CuNi alloy is formed), or so forth.

(Manufacturing Method of Magneto-Resistance Effect Element)

Figure 6:
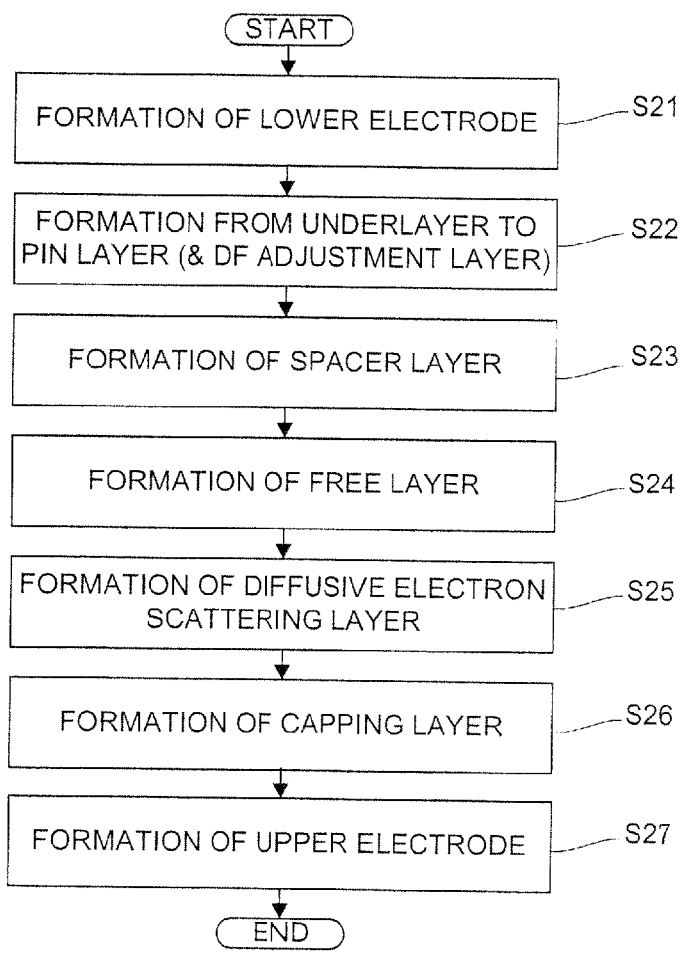
FIG. 6 is a flowchart showing a production process of the magneto-resistance effect element according to the second embodiment of the present invention.

FIG. 6 is a flow chart showing a production process of the magneto-resistance effect element according to the second embodiment of the present invention. FIG. 6 is different from FIG. 2 in respect of the diffusive electron scattering layer 22 which is formed instead of forming the damping-factor adjustment layer 21. Since FIG. 6 is not different from FIG. 2 in other respects, hereinafter, the description will be given only of the diffusive electron scattering layer 22.

To the formation of the diffusive electron scattering layer 22 in Step S25 in FIG. 6, any of (1) to (3) below is applicable.
(1) Formation of Amorphous Layer A layer of a nonmagnetic amorphous material is formed by depositing an alloy material such as AlB containing the previously-described element metal such as Ta at a ratio of at least 50% or more. For this deposition, sputtering methods such as the DC magnetron sputtering method and the RF magnetron sputtering method, the ion-beam sputtering method or the vapor deposition method can be employed.

Note that these materials do not need to adopt an accelerating means accelerating the materials to become amorphous, such as cooling or the like, since the materials can easily become amorphous.
(2) Formation of Mixing Layer 1) As described above, by stacking at least two or more kinds of alloy materials which are in a relation of solid solution with each other by dividing them into two layers, namely a first layer and a second layer, the mixing layer being a solid solution can be formed on their interface. For the stacking of the layers, sputtering methods such as the DC magnetron sputtering method and the RF magnetron sputtering method, the ion-beam sputtering method or the vapor deposition method can be employed. For instance, on the free layer 18a, Al is formed to have a thickness of 0.5 nm as a first layer and Cu is formed to have a thickness of 0.5 nm as a second layer, sequentially. Al and Cu are in a relation of solid solution with each other, so that the mixing layer is formed on the interface, on which the electrons scatter diffusedly. Note that, after stacking Al [0.5 nm]/Cu [0.5 nm], Ru can be stacked to have a thickness of 10 nm to be the capping layer 19 (Step S26 in FIG. 6).

2) It is also possible to perform a surface treatment to the interface between the first layer and the second layer to thereby enhance the formation of the mixing layer. For instance, on the free layer 18a, Al is deposited to have a thickness of 0.5 nm as a first layer and Cu is deposited to have a thickness of 0.5 nm as a second layer thereafter, and a treatment such as plasma or ion beam is performed to the surface thereafter. With the surface treatment being performed, the formation of the mixing layer on the interface between the Al layer and the Cu layer can be enhanced. With the entering energy of ion or the like, atomic elements at the interface between the Al layer and the Cu layer move to mix with each other, so that the formation of the mixing layer is enhanced. This surface treatment may be performed not only after the deposition of the first and second layers, but also in the course of the deposition. For instance, the surface treatment may be performed in the course of the deposition of the second layer after the deposition of the first layer.

For the surface treatment, an inert gas such as Ar, Ne, or the like can be used after plasma production or ionization. At this time, in addition to the ions of the rare gas, neutral atoms can also serve to this surface treatment. When they hold certain energy when entered into the interface, they can move the atomic elements at the interface with or without their ionization. The enhancement of the formation of the mixing layer by the surface treatment is also effective in the case of using the other material combination (for example, Ni and Cu) in addition to the case using the combination of Al and Cu.

Example

As an example of the present invention, the configuration as will be described below can be cited. Here, the Ta layer in the capping layer 19 serves as a diffusive electron scattering layer 22. Specifically, here, the diffusive electron scattering layer 22 is recognized by being included in the capping layer 19. The nonmagnetic layer inside the free layer 18 and the nonmagnetic layer on the interface with the spacer layer 16 are regarded as a damping-factor adjustment layer 21, respectively; however, the nonmagnetic layer stacked on the top of the free layer 18 can be regarded as parts of the capping layer 19.

Here, an upper pin layer 143a is formed by stacking ($Fe_{50}Co_{50}$/Cu) repeatedly twice. As shown in nonpatent document 3, FeCo is used because of its large spin-dependent interface scattering effect, and Cu is stacked to improve the spin-dependent bulk scattering effect. Note that there is no problem when the upper pin layer 143a is formed only by $Fe_{50}Co_{50}$.

Lower electrode 11
  Underlayer 12: Ta [5 nm]/Ru [2 nm]
  Pinning layer 13: $Pt_{50}Mn_{50}$ [15 nm]
  Pin layer 14: $Co_{90}Fe_{10}$ [4 nm]/Ru [0.9 nm]/($Fe_{50}Co_{50}$ [1 nm]/Cu [0.25 nm])×2/$Fe_{50}Co_{50}$ [1 nm]
  Spacer layer 15, 16, and 17
    Lower metal layer 15: Cu [0.5 nm]
    CCP-NOL 16
    Upper metal layer 17: Cu [0.25 nm]
  Free layer 18: $Co_{90}Fe_{10}$ [1 nm]/$Ni_{83}Fe_{17}$ [3.5 nm]
  Capping layer 19: Ta [1 nm]/Cu [10 nm]
  Upper electrode 20

(Magnetic Head)

Figure 10:
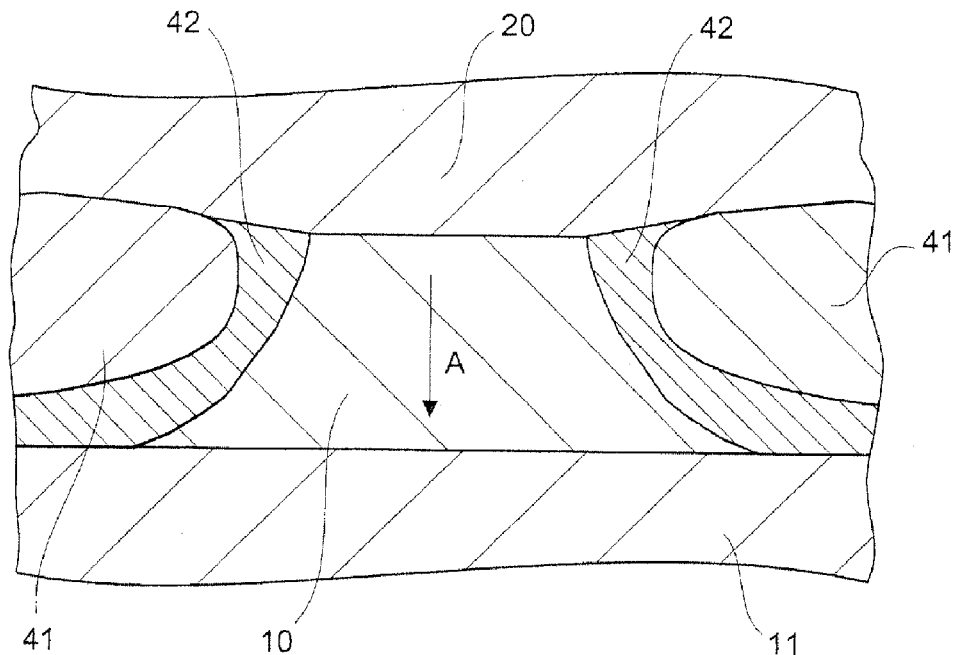
FIG. 10 is a sectional view of a magnetic head according to an embodiment of the present invention.
Figure 11:
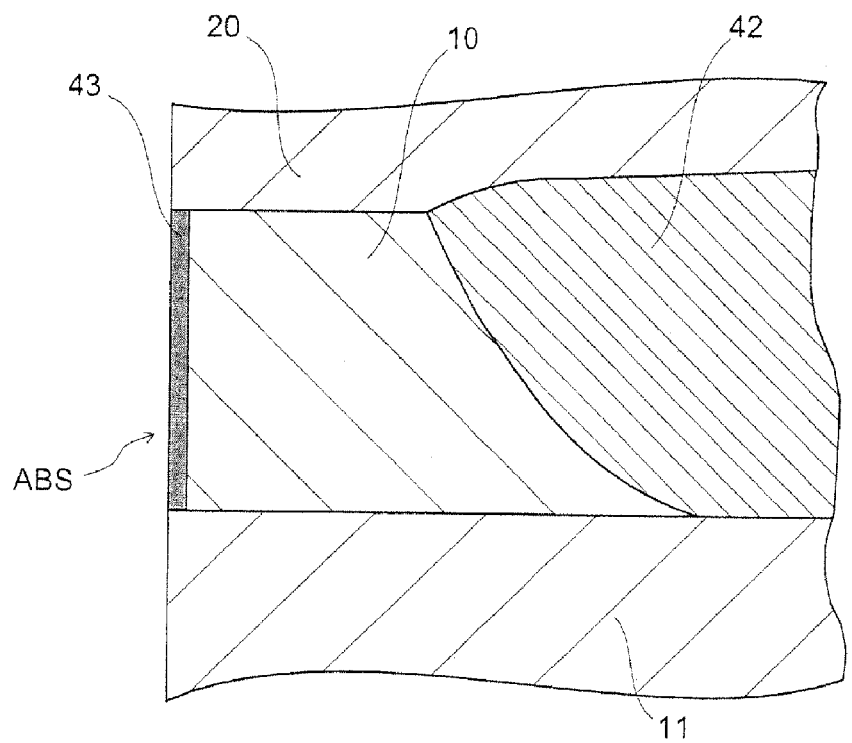
FIG. 11 is a sectional view of the magnetic head according to the embodiment of the present invention.

FIG. 10 and FIG. 11 show a state where the magneto-resistance effect element according to the embodiment of the present invention is embedded into a magnetic head. FIG. 10 is a sectional view taken along a line in the magneto-resistance effect element substantially in parallel with the surface facing a medium facing a magnetic recording medium (not shown). FIG. 11 is a sectional view taken along such a line in the magneto-resistance effect element that is in the vertical direction with respect to the surface ABS facing the medium.

The magnetic head shown as an example in FIG. 10 and FIG. 11 has a so-called hard abutted structure. The magneto-resistance effect film 10 is the previously-described CCP-CPP film. On and under the magneto-resistance effect film 10, the upper electrode 20 and lower electrode 11 are provided, respectively. In FIG. 10, a bias magnetic field-applying film 41 and an insulating film 42 are stacked and provided, respectively, on both the side surfaces of the magneto-resistance effect film 10. As shown in FIG. 11, a protective layer 43 is provided on such a surface of the magneto-resistance effect film 10 that faces with the medium.

With respect to the magneto-resistance effect film 10, the sense current flows in the direction substantially perpendicular to the film surface as shown with an arrow A caused by the electrodes 11, 20 disposed on and under the magneto-resistance effect film 10. Further, by a pair of bias magnetic field-applying films 41, 41 provided on the right and left sides, a bias magnetic field is applied to the magneto-resistance effect film 10. With this bias magnetic field, magnetic anisotropy of the free layer 18 of the magneto-resistance effect film 10 is controlled to be a single magnetic domain and the magnetic domain structure is thereby stabilized, so that Barkhausen noise caused together with a domain wall movement can be prevented.

The S/N ratio of the magneto-resistance effect film 10 is improved, so that a highly sensitive magnetic reproduction can be realized when it is applied to the magnetic head.

(Hard Disk and Head Gimbal Assembly)

Figure 12:
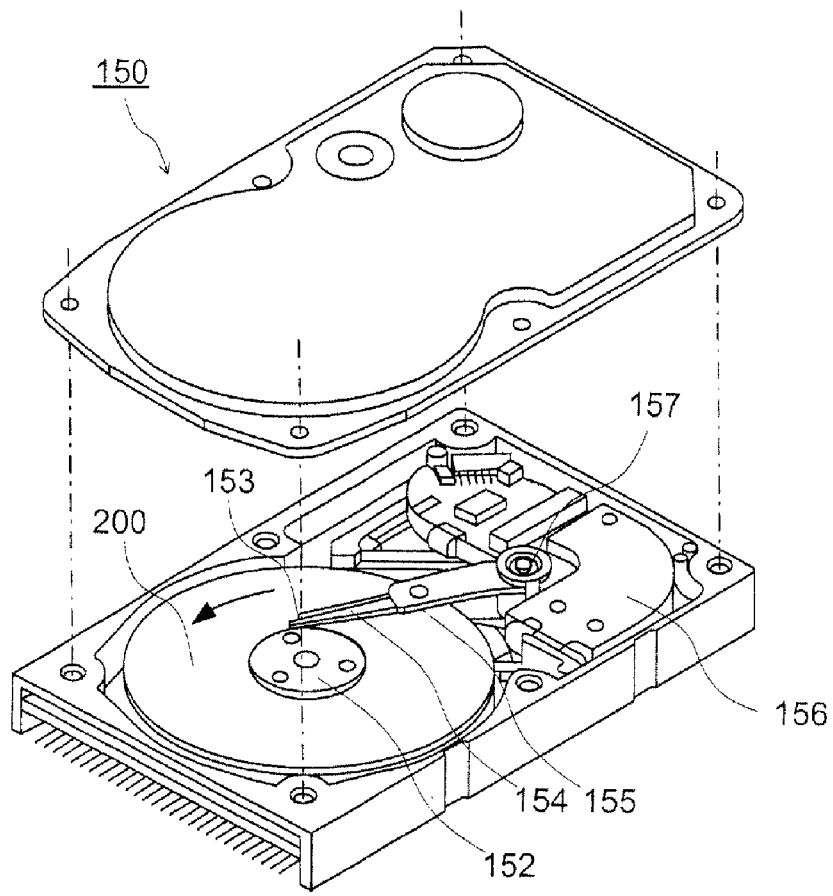
FIG. 12 is a sectional view of a magnetic recording/producing apparatus according to an embodiment of the present invention.

The magnetic head shown in FIG. 10 and FIG. 11 can be installed in a magnetic recording/reproducing apparatus by being mounted in an all-in-one magnetic head assembly allowing both the recording/reproducing. FIG. 12 is a perspective view schematically showing, as an example, a substantial part of the configuration of the magnetic recording/reproducing apparatus of this type.

A magnetic recording/read apparatus 150 according to an embodiment of the present invention is an apparatus of a type using a rotary actuator. In FIG. 12, a magnetic disk 200 is loaded to an axle 152 to turn in the direction of an arrow A driven by a not-shown motor responding to a control signal sent from a not shown drive unit control section. The magnetic recording/reproducing apparatus 150 of the present invention may be that provided with a plurality of magnetic disks 200.

A head slider 153 recording/reproducing information to be stored in the magnetic disk 200 is mounted on a tip of a suspension 154 of a thin film type. The head slider 153 mounts the magnetic head including the magneto-resistance effect element according to any of the above-described embodiments around the tip thereof.

When the magnetic disk 200 turns, such a surface (ABS) of the head slider 153 that faces with the media is held with a predetermined floating amount from the surface of the magnetic disk 200. Alternatively, the slider may be a so-called "contact running type" in which the slider is in contact with the magnetic disk 200.

The suspension 154 is connected to one edge of an actuator arm 155. A voice coil motor 156 being a kind of a linear motor is provided at the other edge of the actuator arm 155. The voice coil motor 156 is composed of a not-shown driving coil wound around a bobbin section and a magnetic circuit composed of a permanent magnet and a counter yoke disposed so as to sandwich the coil.

The actuator arm 155 is held by not-shown ball bearings provided at two positions being on and under an axle 157, thereby the voice coil motor 156 can slide the actuator arm 155 in accordance with the rotation freely.

Figure 13:
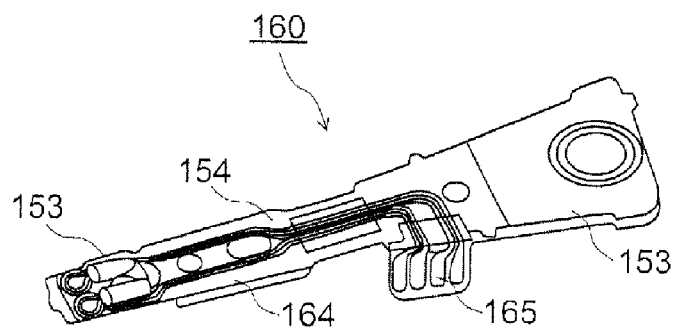
FIG. 13 is a sectional view of a magnetic head assembly according to an embodiment of the present invention.

FIG. 13 is an enlarged perspective view viewing the head gimbal assembly far beyond the actuator arm 155 from the disk side. Specifically, an assembly 160 has the actuator arm 155 of which one edge is connected with the suspension 154. The head slider 153 provided with the magnetic head including the magneto-resistance effect element according to any of the above-described embodiments is mounted on the tip of the suspension 154. The suspension 154 includes a lead wire 164 for writing/reading signals, in which the leadwire 164 is electrically connected with the respective electrodes of the magnetic head embedded in the head slider 153. In the drawing, "165" denotes an electrode pad of the assembly 160.

According to the present embodiment, with the provision of the magnetic head including the above-described magneto-resistance effect element, the reading out of the information magnetically recorded in the magnetic disk 200 at a high recording density can assured.

(Magnetic Memory)

Subsequently, the description will be given of a magnetic memory installing the magneto-resistance effect element according to the embodiment of the present invention. In other word, with the magneto-resistance effect element according to the embodiment of the present invention, a magnetic memory such as a magnetic random access memory (MRAM) in which memory cells are arranged in matrix, can be realized.

Figure 14:
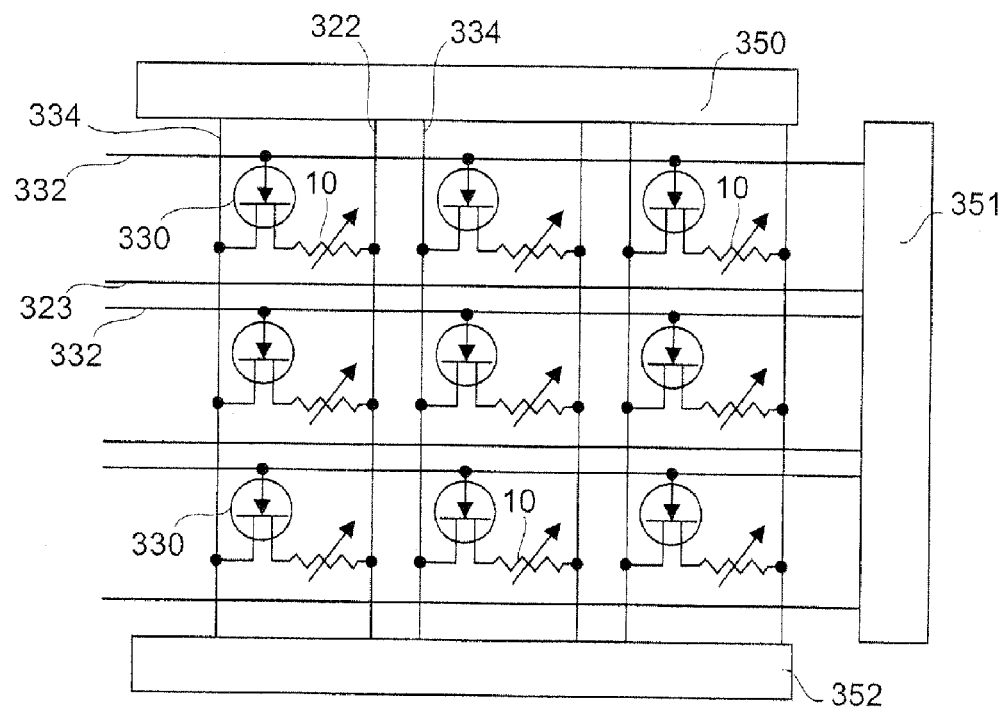
FIG. 14 is a view showing an example matrix structure of a magnetic memory according to an embodiment of the present invention.

FIG. 14 is a view showing an example matrix structure of the magnetic memory according to the embodiment of the present invention. This drawing shows a circuit configuration when the memory cells are arranged in an array. In order to select one bit in the array, a column decoder 350 and a line decoder 351 are provided, in which a switching transistor 330 is turned ON by a bit line 334 and a word line 332 and to be selected uniquely, so that the bit information recorded in a magnetic recording layer (free layer) in the magneto-resistance effect film 10 can be read out by being detected by a sense amplifier 352. In order to write the bit information, write current is made to flow in a specific write word line 323 and a bit line 322 to generate a magnetic field, and the magnetic field is applied.

Figure 15:
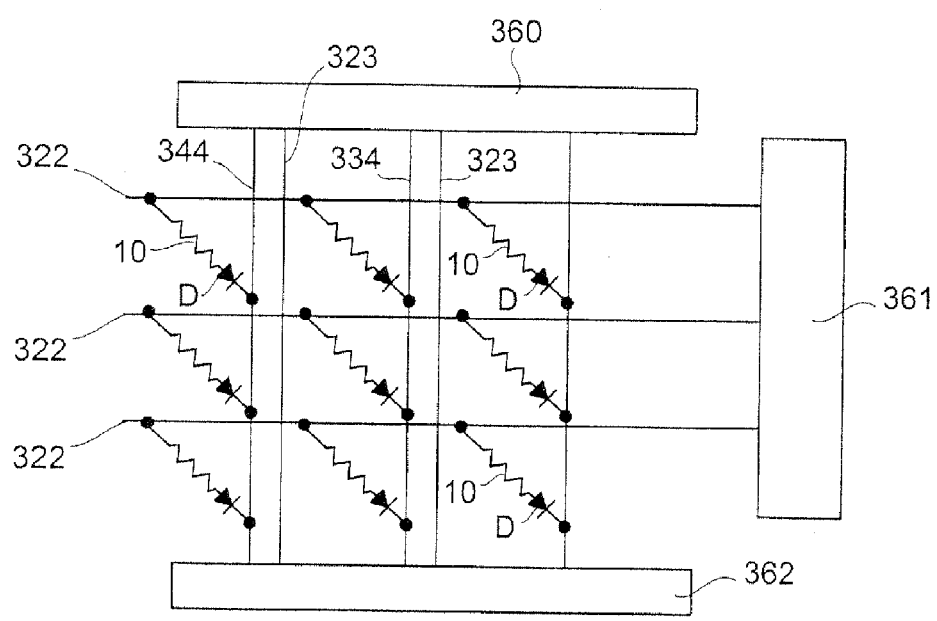
FIG. 15 is a view showing another example matrix structure of the magnetic memory according to the embodiment of the present invention.

FIG. 15 is a view showing another example matrix structure of the magnetic memory according to the embodiment of the present invention. In this case, a bit line 322 and a word line 334 which are arranged in matrix are selected by decoders 360, 361, respectively, so that a specific memory cell in the array is selected. The respective memory cells have a configuration in which the magneto-resistance effect film 10 and a diode D is connected in series. Here, the diode D plays a role of preventing sense current from detouring in the memory cell other than the selected magneto-resistance effect film 10. A writing is performed by a magnetic field generated by making the writing current flow in the specific bit line 322 and a word line 323, respectively.

Figure 16:
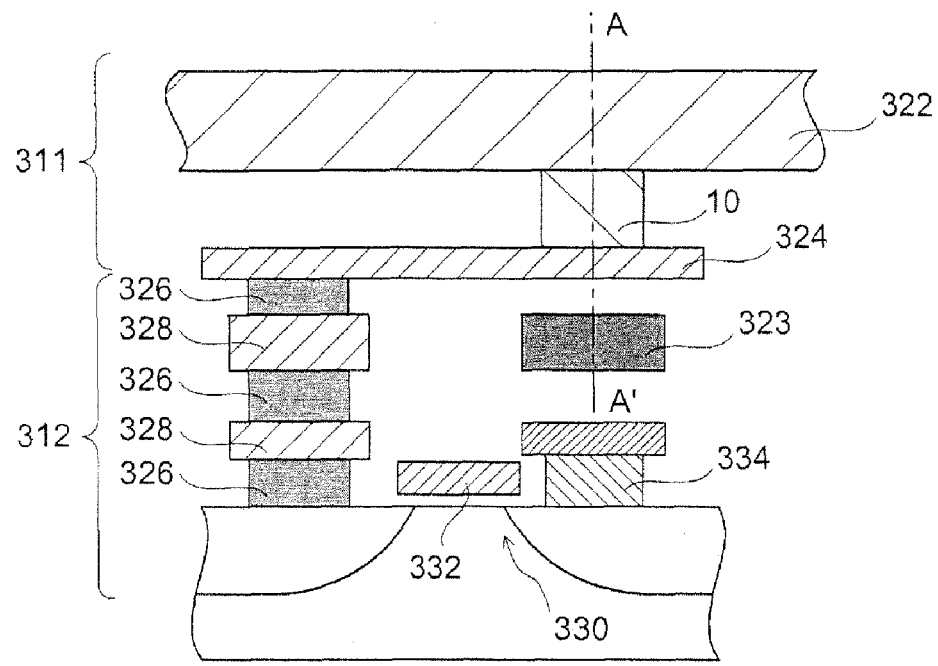
FIG. 16 is a sectional view showing a substantial part of the magnetic memory according to the embodiment of the present invention.
Figure 17:
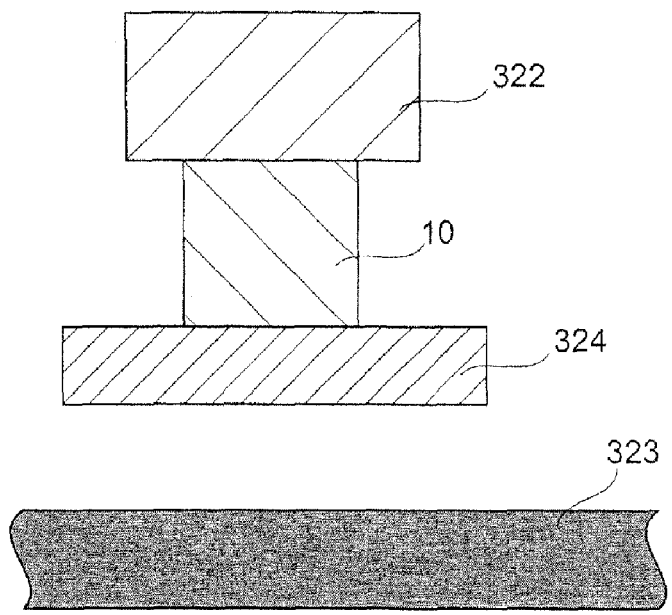
FIG. 17 is a sectional view taken along an A-A' line in FIG. 16.

FIG. 16 is a sectional view showing a substantial part of the magnetic memory according to the embodiment of the present invention. FIG. 14 is a sectional view taken along an A-A' line in FIG. 16. The configuration shown in these drawings corresponds to a 1-bit memory cell included in the magnetic memory shown in FIG. 14 or FIG. 15. This memory cell includes a memory element part 311 and an address selection transistor part 312.

The memory element part 311 includes the magneto-resistance effect film 10 and a pair of wirings 322, 324 connected to the magneto-resistance effect film 10. The magneto-resistance effect film 10 is the magneto-resistance effect element (CCP-CPP element) according to the above-described embodiment.

Meanwhile, in the address selection transistor part 312, a transistor 330 having connection therewith via a via 326 and an embedded wiring 328 is provided. The transistor 330 performs switching operations in accordance with voltages applied to a gate 332 to control opening/closing of the current path between the magneto-resistance effect film 10 and the wiring 334.

Further, below the magneto-resistance effect film 10, a write wiring 323 is provided in the direction substantially orthogonal to the wiring 322. These write wirings 322, 323 can be formed by, for example, aluminum (Al), copper (Cu), tungsten (W), tantalnum (Ta) or an alloy containing any of these.

In the memory cell of such a configuration, when writing bit information into the magneto-resistance effect element 10, write pulse current is made to flow in the wirings 322, 323, and a synthetic magnetic field induced by these currents is applied to appropriately invert the magnetization of a recording layer of the magneto-resistance effect element 10.

Further, when reading out the bit information, sense current is made to flow through the magneto-resistance effect element 10 including the magnetic recording layer and a lower electrode 324 to measure a resistance value of or a fluctuation in the resistance values of the magneto-resistance effect element 10.

The magnetic memory according to the embodiment of the present invention can assure writing and reading by surely controlling the magnetic domain of the recording layer even though the cell is miniaturized in size, with the use of the magneto-resistance effect element (CCP-CPP element) according to the above-described embodiment.

Other Embodiments

The embodiments according to the present invention are not limited to the above-described embodiments and can be extended and modified, and the extended and modified embodiment are also within the technological scope of the present invention.

As for the specific structure of the magneto-resistance effect film and the other shapes and materials of the electrodes, the bias application films, the insulating films and the like; the present invention can be embodied in the same manner as described above and can obtain the same effect as described above by appropriately selecting them from the range known those in the art.

For instance, when the magneto-resistance effect element is applied to a reproducing magnetic head, the detecting and resolving power of the magnetic head can be prescribed by giving a magnetic shield on and under the element, respectively.

Further, the embodiments of the present invention can be applied not only to a longitudinal magnetic recording method but also to the magnetic head or the magnetic reproducing apparatus of a perpendicular magnetic recording method.

Further, the magnetic reproducing apparatus according to the present invention may be a so-called "fixed" type constantly provided with a specific recording medium and also be a so-called "removable" type allowing the recording medium to be replaced.

In addition to the above, every magneto-resistance effect element, magnetic head, magnetic recording/reproducing apparatus and magnetic memory, which can be embodied by those in the art through an appropriate design change on the basis of the magnetic head and the magnetic recording/reproducing apparatus described above as the embodiment of the present invention, also belong to the scope of the present invention.

What is claimed is:
1. A magneto-resistance effect element, comprising:
a magnetization layer;
a free magnetization layer of which magnetization direction changes depending on an external magnetic field;
a spacer layer located between said magnetization layer and said free magnetization layer, and having an insulating layer and an electric conductor passing current therethrough in a layer direction of the insulating layer; and
a diffusive electron scattering layer disposed on said free magnetization layer for scattering diffusive electrons, comprising a first nonmagnetic layer and a second nonmagnetic layer containing a first element and a second element, respectively, and a mixing layer disposed at a boundary between the first and second nonmagnetic layers and containing the first and second elements, the mixing layer having a thickness of 0.5 nm or more and 1.5 nm or less.

2. The magneto-resistance effect element as set forth in claim 1, wherein said diffusive electron scattering layer includes a nonmagnetic amorphous layer.

3. The magneto-resistance effect element as set forth in claim 1, wherein one of said free magnetization layer and said magnetization layer has a size of 100 nm or less.

4. A magneto-resistance effect head comprising, a magneto-resistance effect element as set forth in claim 1.

5. A magnetic storage, comprising a magneto-resistance effect head as set forth in claim 4.

6. A magnetic memory comprising, a magneto-resistance effect element as set forth in claim 1.

* * * * *